(12) United States Patent
Nagumo

(10) Patent No.: US 8,471,884 B2
(45) Date of Patent: Jun. 25, 2013

(54) DRIVING DEVICE, PRINT HEAD AND IMAGE FORMING DEVICE

(75) Inventor: Akira Nagumo, Tokyo (JP)

(73) Assignee: Oki Data Corporation, Tokyo (JP)

( * ) Notice: Subject to any disclaimer, the term of this patent is extended or adjusted under 35 U.S.C. 154(b) by 168 days.

(21) Appl. No.: 13/112,058

(22) Filed: May 20, 2011

(65) Prior Publication Data

US 2011/0285805 A1    Nov. 24, 2011

(30) Foreign Application Priority Data

May 21, 2010    (JP) .................................. 2010-117106

(51) Int. Cl.
*B41J 2/435* (2006.01)
(52) U.S. Cl.
USPC ........................................................ 347/247
(58) Field of Classification Search
None
See application file for complete search history.

(56) References Cited

U.S. PATENT DOCUMENTS

| 4,027,230 | A | * | 5/1977 | Takemura ...................... 323/350 |
| 5,969,744 | A | * | 10/1999 | Sakashita et al. ............. 347/237 |
| 8,174,031 | B2 | * | 5/2012 | Kondoh .......................... 257/82 |

FOREIGN PATENT DOCUMENTS

JP    A-2004-195796    7/2004

* cited by examiner

*Primary Examiner* — Matthew Luu
*Assistant Examiner* — Kendrick Liu
(74) *Attorney, Agent, or Firm* — Posz Law Group, PLC

(57) ABSTRACT

A driving device controls light emitting thyristors that each include a scanning circuit sequentially driving each of the plural stages of the light emitting thyristors by controlling scanning thyristors. Herein, terminals of each odd numbered stage of the scanning thyristors is commonly connected to a first clock terminal, and terminals of each even numbered stage of the scanning thyristors is commonly connected to a second clock terminal. A control terminal of a first stage scanning thyristor is connected to the second clock terminal, and another control terminal of a previous scanning thyristor is connected to the second control terminal of a subsequent scanning thyristor.

10 Claims, 12 Drawing Sheets

US 8,471,884 B2

DRIVING DEVICE, PRINT HEAD AND IMAGE FORMING DEVICE

CROSS REFERENCE TO RELATED APPLICATION

The present application is related to, claims priority from and incorporates by reference Japanese Patent Application No. 2010-117106, filed on May 21, 2010.

TECHNICAL FIELD

The present embodiments relate to a driving device that drives a plurality of light emitting thyristor arrays formed from a plurality of light emitting thyristors, a print head that includes the driving device, and an image forming device.

BACKGROUND

There are image forming devices, such as electrographic printers, in which an exposure part is configured from a plurality of light emitting thyristors arrayed as light emitting elements. In such image forming devices using the light emitting thyristors, a driving circuit and the light emitting thyristors are provided at a ratio of 1:N (N>1). Positions of the light emitting thyristors to be driven are designated by using the gates of the light emitting thyristors. Light emission power is controlled by a value of current that flows between the anodes and cathodes of the respective light emitting thyristors.

So-called self scanning print heads are known as print heads that use the light emitting thyristors. When driving a conventional self scanning print head under a power source voltage of 3.3 V, gate trigger current cannot be generated with the 3.3 V for the power source voltage. To compensate for this, a configuration is known in which an undershoot voltage is generated in a transfer clock signal waveform (hereinafter "clock signal" is simply referred to as "clock"), and in which the gate trigger current is generated with an added value of the undershoot voltage and 3.3 V for the power source voltage.

For example, according to the technique disclosed in Japanese Laid-Open Patent Application Publication No. 2004-195796, in order to generate the transfer clock waveform, a first output terminal and a second output terminal are provided in a clock driving circuit. A transfer clock outputted from the first output terminal is transmitted to a capacitor-resistor (CR) differential circuit to generate an undershoot waveform, and a direct current component is transmitted through the second output terminal. The reason for the two output terminals provided per transfer clock in the clock driving circuit is that the direct current component cannot be transmitted through the CR differential circuit and therefore that a current path needs to be separately provided to maintain the electric current that turns on the light emitting thyristors.

However, in the conventional self scanning print head, there are the following concerns with two output terminals per transfer clock in the clock driving circuit.

In the print head, a large number of self scanning thyristor array chips are provided, and the operation of the self scanning light emitting thyristor array chips is simultaneously performed in parallel for high speed operation. A 2-phase clock is used as a data transfer clock for the thyristor array chips, and two clocks are inputted to each thyristor array chip. Therefore, four output terminals are required in a clock driving circuit for the self scanning print head for driving each thyristor array chip.

Because a large number of self scanning thyristor array chips are arranged in a print head, the total number of output terminals provided in a clock driving circuit becomes enormous. If the number of terminals are controlled so that the terminals can be accommodated in a large-scale integration (hereinafter "LSI") package, a large number of chips that are connected in parallel and that are driven by a clock driving circuit are required, causing waveform rounding. As a result, there is a problem that the operation of the print head cannot be performed at high speed. In addition, there is a problem in the LSI that a large number of external parts, such as capacitors, for the CR differential circuit are required, which causes the cost to increase.

Therefore, lower-cost circuitry is desired that drives self scanning light emitting thyristors array chips using a buffer-circuit integrated circuit (hereinafter an "integrated circuit" is referred to as an "IC") that operates under a 3.3 V power source, for example, without increasing the number of terminals that can be accommodated in an LSI package that drives the print heads, and with a decreased number of external parts.

SUMMARY

A driving device of the present application that drives a light emitting thyristor array including plural stages of light emitting thyristors that each include a first terminal commonly connected to a common power source, a second terminal commonly connected to a common terminal, and a first control terminal that performs on-off switching between the first and second terminals, the driving device including: a first driving circuit that is operated by the power source and that drives the common terminal to high and low logic levels; a scanning circuit that includes plural stages of scanning thyristors that each include a third terminal commonly connected to the common power source, a fourth terminal, second and third control terminals that each perform on-off switching between the third and fourth terminals, the second control terminal being connected to the first control terminal of a corresponding one of the light emitting thyristors, the scanning circuit sequentially driving each of the plural stages of the light emitting thyristors by controlling the scanning thyristors; and a second driving circuit that is operated by the power source, that generates a first clock signal and a second clock signal for driving the scanning circuit, and that outputs the first and second clock signals from a first clock terminal and a second clock terminal, respectively, wherein the fourth terminal of each odd numbered stage of the scanning thyristors is commonly connected to the first clock terminal, the fourth terminal of each even numbered stage of the scanning thyristors is commonly connected to the second clock terminal, the second control terminal of a first stage scanning thyristor is connected to the second clock terminal, and the third control terminal of a previous scanning thyristor is connected to the second control terminal of a subsequent scanning thyristor via an electrical connection part.

In driving devices and print heads according to the present specification, one clock terminal is necessary for each transfer clock in the second driving circuit, which reduces the number of terminals required by half compared with a conventional configuration. In addition, areas for arranging external parts, such as capacitors, that are provided in the driving circuit of the conventional configuration are reduced. Therefore, not only is the data transfer speed improved in the print head, but also circuit size and cost are reduced as a result of the reduced number of clock terminals in the second driving circuit.

In addition, the third control terminal in each previous stage scanning thyristor is connected to the second control terminal of a subsequent stage scanning thyristor via an electrical connection part (e.g., resistor). Therefore, the scanning direction of a scanning circuit is determined based on the first and second clocks, which are 2-phase clocks, thereby preventing the scanning circuit from malfunction. In the present invention, the electrical connection part is not necessarily a resistor. As long as functioning to let current flow in a certain direction, several types of devices are available such as a diode or transistor, which are arranged in accordance with the current flow.

According to the image forming device of the present specification, because the above-described configuration is adapted, a high quality image forming device is provided with excellent space efficiency and light extraction efficiency.

DETAILED DESCRIPTION OF THE EMBODIMENTS

Embodiments of the present application become apparent when the description of the embodiments herein is read with reference to the attached drawings. However, the drawings are for explanatory purposes only and are not intended to limit the scope of the present embodiments.

Figure 2:
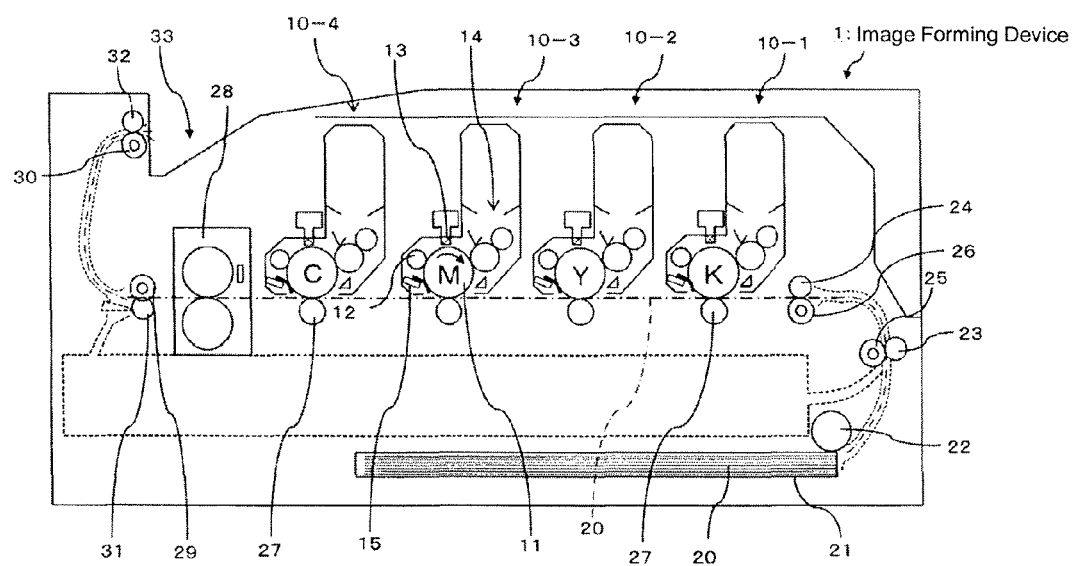
FIG. 2 illustrates a schematic configuration of an image forming device according to the first embodiment.

First Embodiment (Image Forming Device of First Embodiment) FIG. 2 illustrates a schematic configuration of an image forming device according to the first embodiment.

The image forming device 1 is configured from a tandem electrographic color printer, in which an exposure device (e.g., print head) including a light emitting thyristor array that uses driven elements (e.g., 3-terminal light emitting thyristors as the light emitting element) is installed. The image forming device 1 includes four process units 10-1 to 10-4, which form images in black (K), yellow (Y), magenta (M) and cyan (C), respectively. The process units 10-1 to 10-4 are sequentially arranged from the upstream side of a carrying path of a recording medium (e.g., paper) 20. Because the internal configuration of each of the process units 10-1 to 10-4 is the same, the internal configuration of the magenta process unit 10-3, for example, is explained as an example.

In the process unit 10-3, a photosensitive body (e.g., photosensitive drum 11), which functions as an image carrier, is rotatably arranged in the direction of the arrow shown in FIG. 2. Around the photosensitive drum 11, a charge device 12 that supplies electric charge to, and charges, the surface of the photosensitive drum 11, and a print head 13, which functions as an exposure device, that forms an electrostatic latent image on the photosensitive drum 11 by irradiating light selectively onto the charged surface of the photosensitive drum 11, are provided in order from the upstream side of the rotational direction. In addition, a developing device 14 and a cleaning device 15 are arranged. The developing device 14 develops an image by attaching magenta (predetermined color) toner on the surface of the photosensitive drum 11, on which the electrostatic latent image has been formed. The cleaning device 15 removes residue toner after the toner image is transferred on the photosensitive drum 11. The drum and rollers used in each of these devices are rotated by the motive power transmitted from a drive source (not shown) via gears and the like.

A sheet cassette 21 with sheets 20 stored therein is installed in the lower part of the image forming device 1. A hopping roller 22 for separating and carrying the sheets 20 piece by piece is provided above the sheet cassette 21. On the downstream side of the hopping roller 22 in a carrying direction of the sheet 20, pinch rollers 23 and 24, a carrying roller 25 and a registration roller 26 are provided. The carrying roller 25 carries the sheet 20 by pinching the sheet 20 with the pinch roller 23. The registration roller 26 corrects oblique passage of the sheet 20 and carries the sheet to the process unit 10-1 by pinching the sheet 20 with the pinch roller 24. The hopping roller 22, the carrying roller 25 and the registration roller 26 are rotated by the motive power transmitted from a drive source (not shown) via gears and the like.

At a position opposing the photosensitive drum 11 in each of the process units 10-1 to 10-4, a transfer roller 27 is provided that is formed from a semi-conductive rubber or the like. Electric charge is applied to each transfer roller 27 when transferring the toner image attached to the photosensitive drum 11 onto the sheet 20, so that a potential difference is provided between surface potential of the photosensitive drum 11 and surface potential of the transfer roller 27.

A fuser 28 is provided on the downstream side the process unit 10-4. The fuser 28 includes a heating roller and a backup roller. The fuser 28 is a device to fix the toner transferred onto the sheet 20 by pressure and heating. On the downstream side of the fuser 28, there are ejection rollers 29 and 30, ejection part pinch rollers 31 and 32, and a sheet stacker 33. The ejection rollers 29 and 30 pinch the sheet 20 ejected from the fuser 28, with the ejection part pinch rollers 31 and 32, respectively, and carry the sheet 20 to the sheet stacker 33. The fuser 28, the ejection roller 29 and the like are rotated by the motive power transmitted from the drive source (not shown) via gears and the like.

The image forming device 1 with the above-described configuration operates as follows. First, the sheets 20 stacked and stored in the sheet cassette 21 are carried piece by piece by the hopping roller 22. Then, each sheet 20 is pinched by the carrying roller 25, the registration roller 26 and the pinch rollers 23 and 24 and is carried between the photosensitive drum 11 and the transfer roller 27 of the process unit 10-1. The sheet 20 is sandwiched by the photosensitive drum 11 and the transfer roller 27 and is carried by the rotation of the photosensitive drum 11 while the toner image is transferred onto the recording surface of the sheet 20. The sheet 20 sequentially passes through the process units 10-2 to 10-4 in a similar manner. During this process, the toner image in each color, which is the image of the electrostatic latent image formed by the respective print head 13 and developed by the respective developing device 14, is sequentially transferred and superimposed on the recording surface of the sheet 20.

After the toner image in each color is superimposed on the recording surface of the sheet 20, the toner image is fixed on the sheet 20 by the fuser 28. Then, the sheet 20 is pinched by the ejection rollers 29 and 30 and the pinch rollers 31 and 32, respectively, and is ejected to the sheet stacker 33 outside the image forming device 1. A color image is formed on the sheet 20 through these processes.

Figure 3:
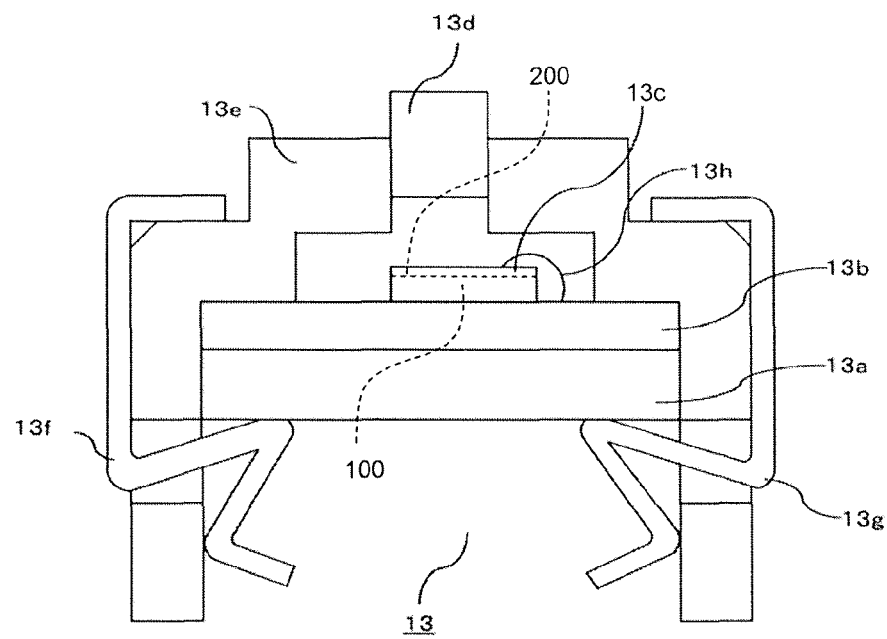
FIG. 3 is a schematic cross-sectional view that illustrates a configuration of a print head shown in FIG. 2.
Figure 4:
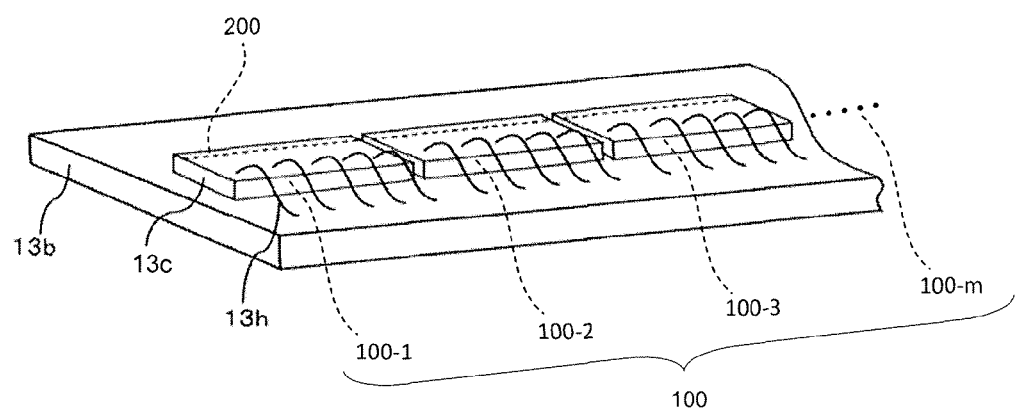
FIG. 4 is a perspective view that illustrates a substrate unit shown in FIG. 3.

(Print Head in First Embodiment) FIG. 3 is a schematic cross-sectional view that illustrates a configuration of the print head 13 shown in FIG. 2. FIG. 4 is a perspective view that illustrates the substrate unit shown in FIG. 3.

The print head 13 shown in FIG. 3 includes a base member 13a. The substrate unit shown in FIG. 4 is fixed on the base member 13a. The base unit is configured from a printed wiring board 13b that is fixed on the base member 13a and a plurality of IC chips 13c that is fixed by adhesive or the like on the printed wiring board 13b. "m" pieces of scanning circuits 100 are integrated on each IC chip 13c as self scanning parts. A light emitting thyristor array 200, on which a light element array (e.g., light emitting thyristor array) is approximately linearly provided, is arranged on each scanning circuit 100 as the main light emitting part. A plurality of terminals (not shown) on each IC chip 13c is electrically connected to a wiring pad (not shown) on the printed wiring board 13b by bonding wires 13h.

A lens array (e.g., rod lens array 13d), in which a large number of pillar-shaped optical elements are arranged, is positioned above the light emitting element array 200 on the plurality of IC chips 13c. The rod lens array 13d is fixed by a holder 13e. The base member 13a, the printed wiring board 13b and the holder 13e are fixed by clamp members 13f and 13g.

Figure 5:
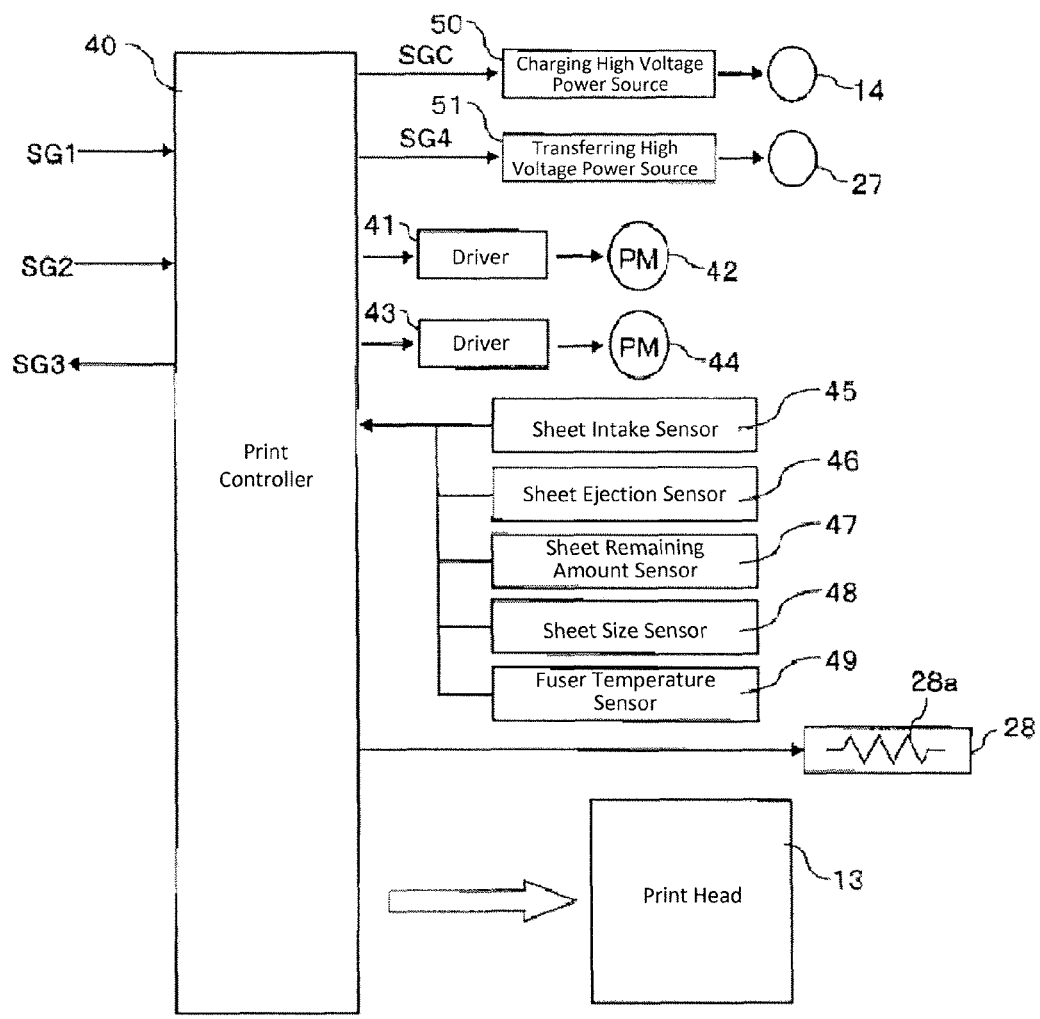
FIG. 5 is a block diagram that illustrates a schematic configuration of a printer control circuit in the image forming device shown in FIG. 2.

(Printer Control Circuit in First Embodiment) FIG. 5 is a block diagram that illustrates a configuration of a printer control circuit in the image forming device 1 shown in FIG. 2. To simplify the explanation, of four process units 10-1 to 10-4 disclosed in FIG. 2, a configuration for controlling one process unit (e.g., process unit for magenta 10-3) is shown in FIG. 5.

The printer control circuit shown in FIG. 5 includes a print controller 40 provided inside a printing part in the image forming device 1. The print controller 40 is configured from a microprocessor, a read-only memory (ROM), a random access memory (RAM), an input/output port for input and output of signals, a timer and the like. The print controller 40 has a function to perform print operations by sequence control of the entire printer using a control signal SG1 from a host controller (not shown), a video signal (one-dimensionally arrayed dot map data) SG2 and the like. The print head 13 for the respective one of the process units 10-1 to 10-4, a heater 28a for the fuser 28, drivers 41 and 43, a sheet intake sensor 45, a sheet ejection sensor 46, a remaining sheet amount sensor 47, a sheet size sensor 48, a fuser temperature sensor 49, a charging high voltage power source 50, a transferring high voltage power source 51 and the like are connected to the print controller 40. A developing/transferring process motor (permanent magnet or PM) 42 is connected to the driver 41. A sheet feeding motor (PM) 44 is connected to the driver 43. The developing device 14 is connected to the charging high voltage power source 50. The transfer roller 27 is connected to the transferring high voltage power source 51.

The following operation is performed on the printer control circuit with such a configuration. When the print controller 40 receives a print instruction by the control signal SG1 from the host controller, the print controller 40 first detects a temperature of the heater 28 by the fuser temperature sensor 49. More specifically, the print controller 40 determines using the fuser temperature sensor 49 whether or not the heater 28a in the fuser 28 is in a usable temperature range. When the heater 28a is not in the temperature range, electricity is passed through the heater 28a to heat the heater 28a to the usable temperature. Next, the developing/transferring process motor 42 is initiated. At the same time, the charging high voltage power source 50 is turned to the ON state by a charge signal SGC to charge the developing device 14.

Then, the presence and type of the sheet 20 stored in the sheet cassette 21 shown in FIG. 2 are detected by the remaining sheet amount sensor 47 and the sheet size sensor 48, and the sheet feeding that is appropriate for the detected sheet 20 is commenced. The sheet feeding motor 44 is bidirectionally rotatable by the driver 43. The sheet feeding motor 44 is first rotated in the reverse direction to feed the set sheet 20 by the predetermined amount until the sheet intake sensor 45 detects the sheet 20. Then, the sheet feeding motor 44 is rotated in the forward direction to carry the sheet 20 into the print mechanism inside the printer.

When the sheet 20 reaches a printable position, the print controller 40 sends a timing signal SG3 (including a main-scanning synchronization signal and a sub-scanning synchronization signal) to the image processor (not shown) and receives the video signal SG2. The video signal SG2, which has been edited for each page by the image processor and received by the print controller 40, is transmitted to each print head 13 as print data. Each print head 13 includes a scanning circuit 100 and a light emitting thyristor array 200 for single dot (pixel) printing.

Transmission and reception of the video signal SG2 is performed for each print line. The information to be printed by each print head 13 becomes a latent image with dots having increased potential on the respective photosensitive drum 11 (not shown) that has been charged by negative potential. The toner for image formation that has been charged by the negative potential adheres to each dot by electric attraction at the developing device 14 to form a toner image.

Thereafter, the toner image is forwarded to the transfer roller 27. In addition, the transferring high voltage power source 51 is turned to the ON state with positive potential by the transfer signal SG4. Therefore, the transfer roller 27 transfers the toner image on the sheet 20 that passes between the photosensitive drum 11 and the transfer roller 27. The sheet 20 with the transferred toner image is carried in contact with the fuser 28 that includes the heater 28a. The toner image is fixed onto the sheet 20 by the heat of the fuser 28. The sheet 20 with the fixed image is further carried from the print mechanism of the printer and through the sheet ejection sensor 46, and is ejected outside the printer.

The print controller 40 applies the voltage from the transferring high voltage power source 51 to the transfer roller 27 only while the sheet 20 passes the transfer roller 27 in response to the detection by the sheet size sensor 48 and the sheet intake sensor 45. When the printing is completed and the sheet 20 passes the sheet ejection sensor 46, application of the voltage to the developing device 14 by the charging high voltage power source 50 is stopped. At the same time, rotation of the developing/transferring process motor 42 is stopped. The above-described operation is repeated thereafter.

Figure 6:
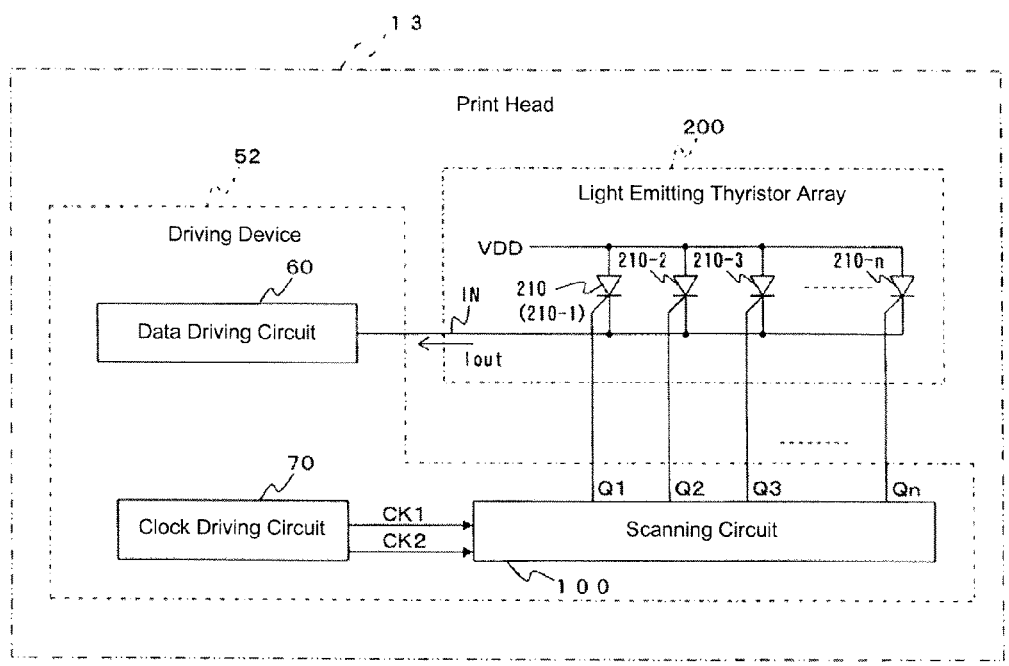
FIG. 6 is a schematic block diagram that illustrates a configuration of the print head shown in FIG. 5 according to the first embodiment.

(Print Head in First Embodiment) FIG. 6 is a block diagram that illustrates a schematic configuration of the print head 13 shown in FIG. 5 according to the first embodiment.

The print head 13 includes a light emitting thyristor array 200 formed on the IC chip 13c shown in FIG. 4, and a driving device 52 that drives the light emitting thyristor array 200. The driving device 52 is formed on the IC chip 13c shown in FIG. 4. The driving device 52 includes a scanning circuit 100 that outputs, from a plurality of output terminals Q1-Qn, signals for scanning the light emitting thyristor array 200 based on 2-phase clocks including a first clock and a second clock, a first driving circuit (e.g., data driving circuit 60) for driving a common terminal IN of the light emitting thyristor array 200 at a high-logic level (hereinafter referred to as "H level") and a low-logic level (hereinafter referred to as "L level"), and a second driving circuit (e.g., clock driving circuit 70) that generates and outputs the first clock and the second clock for driving the scanning circuit 100 respectively from a first clock terminal CK1 and a second clock terminal CK2, respectively.

The light emitting thyristor array 200, which is scanned by the scanning circuit 100, is configured from a plural stages of P-gate light emitting thyristors 210 (210-1 to 210-m), which are 3-terminal thyristors, for example, as light emitting elements. In the embodiment, the numeral "m" represents the number of the emitting thyristors disposed on an IC chip. Each light emitting thyristor 210 includes a first terminal (e.g., anode), a second terminal (e.g., cathode) and a first control terminal (e.g., gate). The anode is connected to a power source (e.g., a VDD power source that outputs 3.3 V power source voltage VDD). The cathode is connected to the data driving circuit 60 via the common terminal IN through which drive current Iout flows as a data signal (hereinafter referred simply as "data"). The gate is connected to respective ones of output terminals Q1-Qm of the scanning circuits 100. As discussed below, the light emitting thyristors 210-1 to 210-m are divided into a plurality of groups of light emitting thyristors 210-1 to 210-n. Each group is separately and simultaneously driven in parallel by respective ones of the self scanning circuits 100. Similarly, the output terminals Q1-Qm are divided into a plurality of groups of output terminals Q1-Qn. Herein, the numeral "n" represents the numbers of the light emitting thyristors 210 and output terminals Q which belong to one group or array. Each light emitting thyristor 210 emits light when a trigger signal (e.g., trigger current) flows to the gate under a state where the power source voltage VDD is applied between the anode and cathode, and the light emitting thyristor 210 is turned to the ON state as cathode current flows between the anode and the cathode.

Figure 1:
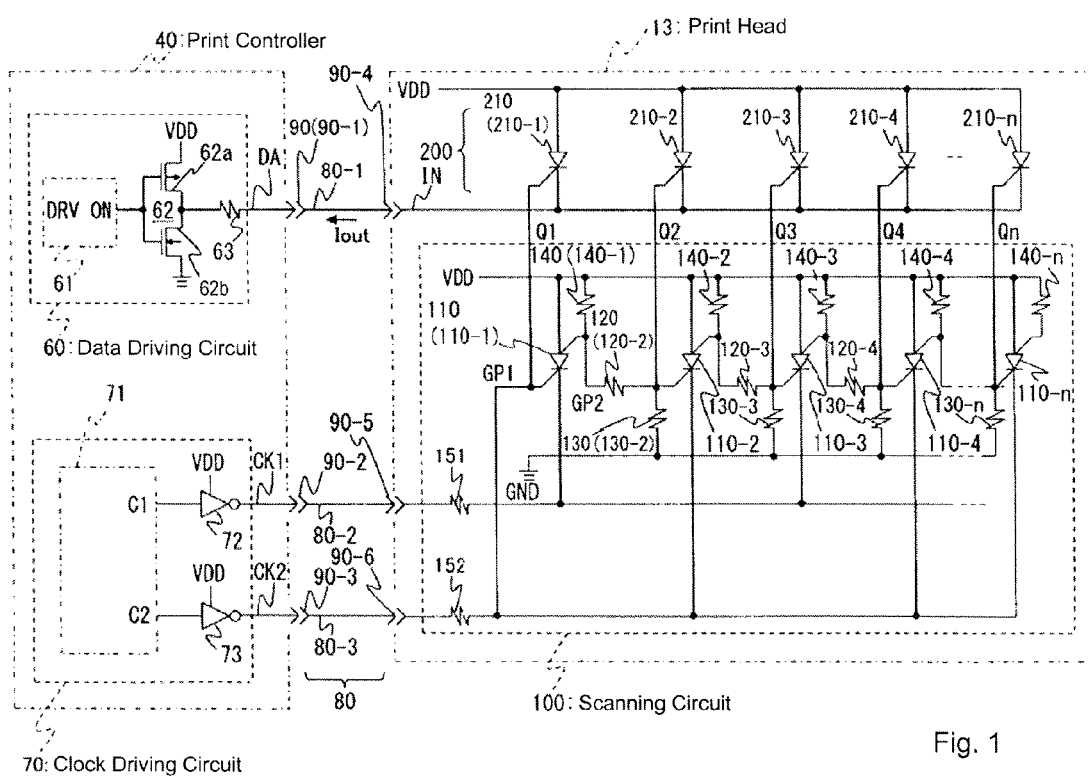
FIG. 1 is a block diagram that illustrates a configuration of a print head shown in FIG. 6 according to a first embodiment.

FIG. 1 is a circuit diagram that illustrates a configuration of the print head 13 shown in FIG. 6 in the first embodiment. In the print head 13 shown in FIG. 1, among the data driving circuit 60, the clock driving circuit 70 and the scanning circuit 100 that configure the driving device 52, the scanning circuit 100 is arranged in the print head 13, and the data driving circuit 60 and the clock driving circuit 70 are arranged in a print controller 40. As shown in FIG. 6, the data driving circuit 60 and the clock driving circuit 70 may be arranged inside the print head 13.

The print head shown in FIG. 1 includes the scanning circuits 100 and the light emitting thyristor arrays 200 formed on the IC chips 13c shown in FIG. 4. The scanning circuits 100 and the light emitting thyristor arrays 200 are connected to a plurality of data driving circuits 60 and clock driving circuits 70 via a plurality of connection cables 80 (80-1 to 80-3) and a plurality of connection connectors 90 (90-1 to 90-6), respectively.

For the plural stages of the light emitting thyristors 210 (210-1 to 210-n) that configure the light emitting thyristor array 200, the anode is connected to the VDD power source, the cathode is connected to the connection connector 90-4 via the common terminal IN, and the gate is connected to respective ones of output terminals Q1-Qn of the scanning circuits 100. The total number of the light emitting thyristors 210-1 to 210-m (and output terminals Q1-Qm) is 4,992 (m=4,992) with the print head 13, which is capable of printing an A4-size sheet at a resolution of 600 dots per inch. These light emitting thyristors form the array.

Each scanning circuit 100 is driven by the first and second clocks, which are 2-phase clocks, supplied from the clock driving circuit 70 via the first and second clock terminals CK1 and CK2, the connection connectors 90-2 and 90-3, and the connection cables 80-2 and 80-3, and the connection connectors 90-5 and 90-6. The scanning circuit 100 is a circuit that causes the light emitting thyristors array 200 to perform ON/OFF switching by applying the trigger current thereto. The scanning circuit 100 includes plural stages of 4-terminal thyristors 110 (e.g., P-gate scanning thyristors 110-1 to 110-n; e.g., n=192, which are formed from six layers of PNP-NPN), a plurality of electrical connection parts 120 (e.g., resistors 120-2 to 120-n), and a plurality of resistors 130 (130-2 to 130-n) and 140 (140-1 to 140-n), and resistors 151 and 152. The scanning circuit 100 is configured from self scanning shift resistors.

The scanning thyristors 110 (110-1 to 110-n) of the respective stages each include a third terminal (e.g., anode), a fourth terminal (e.g., cathode), a second control terminal (e.g., first gate) GP1 and a third control terminal (e.g., second gate) GP2. The anodes are connected to the VDD power source. The first gates GP1 are connected to the gates of the light emitting thyristors 210 of the respective stages via the respective connection terminals Q1-Qn and are also connected to ground GND via the respective resistors 130 (130-2 to 130-n). The second gate G2 is connected to the VDD power source via the respective resistors 140 (140-1 to 140-n). However, the resistor 130 is not provided between the first gate GP1 of the first stage scanning thyristor 110-1 and ground GND.

The cathodes of the odd numbered stage scanning thyristors 110-1, 110-3, . . . , 110-(n−1) are connected to the connection connector 90-5 via the resistor 151. The cathodes of the even numbered stage scanning thyristors 110-2, 110-4, . . . , 110-n are connected to the connection connector 90-6 via the resistor 152.

The first gate GP1 of the first stage scanning thyristor 110-1 is connected to the connection connector 90-6 via the resistor 152. Of the first stage scanning thyristor 110-1 to the last stage scanning thyristor 110-n, the second gates GP2 of the previous stage scanning thyristor 110 (e.g., scanning thyristor 110-1) and the first gates GP1 of the subsequent stage scanning thyristor 110 (e.g., scanning thyristor 110-2) are connected to each other via the respective resistors 120 (120-2 to 120-n). Each resistor 120 is provided for determining a scanning direction (e.g., rightward direction in FIG. 1) at the time when the scanning thyristors 110-1 to 110-n are sequentially turned on.

The scanning thyristor 110 of each stage and the light emitting thyristor 210 of each stage have a similar layer structure as semiconductor elements and perform similar circuit operations. The light emitting thyristor 210 of each stage is used mainly for the light emitting function. In contrast, because the scanning thyristor 110 does not require the light emitting function, the upper layer of the self scanning thyristor 111 is covered by a non-translucent material, such as a metal film, which blocks light.

In the scanning circuit 100, the scanning thyristors 110-1 to 110-$n$ are alternatively turned on based on the first and second clocks, which are 2-phase clocks, supplied from the first and second clock terminals CK1 and CK2 of the clock driving circuit 70. The ON state is transmitted to the light emitting thyristor array 200 and functions to designate a light emitting thyristor to emit light among the light emitting thyristors 210-1 to 210-$n$. The ON state of the scanning thyristors 110 of each stage to be turned on is transmitted to the adjacent scanning thyristor 110 for each of the first and second clocks, which are 2-phase clocks, and thereby performing a circuit operation similar to a shift resistor.

Each of the first gates GP1 in the second to last stage scanning thyristors 110-2 to 110-$n$ are connected to ground GND via the resistors 130-2 to 130-$n$. The resistor 130 does not exist between the first gate GP1 of the first stage scanning thyristor 110-1 and ground GND. This is to reduce the number of parts. If cost is not a consideration, the resistor 130 may be provided between the first gate GP1 of the first stage thyristor 110-1 and ground GND.

There is the following advantage from not providing the resistor 130 that connects the first gate GP1 of the first stage scanning thyristor 110-1 and ground GND.

In a waiting state in which operation of the image forming device 1 is stopped, the first and second clocks supplied from the first and second clock terminals CK1 and CK2 are at the H level. If the resistor 130 is provided between the first gate GP1 of the scanning thyristor 110-1 and ground GND, the current continues to flow from the clock terminal CK2, which is at the H level, to ground GND through the resistor 152, the first gate GP1 of the scanning thyristor 110-1 and the resistor 130. Such current during the waiting period causes unnecessary power consumption, which is not desired because of the increase in electric power consumed during the waiting period of the image forming device 1. In addition, the current that flows through the resistor 130 between the first gate GP1 of the scanning thyristor 110-1 and ground GND makes measurement of leak current difficult during an inspection process that is performed the thyristor chips or the print head 13 are manufactured.

If there is a problem in the scanning thyristors 110-1 to 110-$n$ due to a defect in the semiconductor manufacturing process, a small leak current of one microampere or less may occur. Defective products are removed by measuring and detecting the leak current. However, if the above-described current consumed during the waiting period is generated, the detection of the small increase in the current due to the leak current becomes difficult.

In contrast, according to the configuration shown in FIG. 1, because the resistor 130 is not provided between the first gate GP1 of the scanning thyristor 110-1 and ground GND, it becomes possible to remove the current that steadily flows through the resistor 130. Therefore, the electric power consumed during the waiting period can be approximately zero, resulting in an excellent energy saving effect. Additionally, potential defective products caused by the leak current can be effectively removed during the inspection process, thereby dramatically improving the product quality.

The second gates GP2 of the scanning thyristors 110-1 to 110-$n$ are connected to the VDD power source via the resistors 140-1 to 140-$n$, respectively. These resistors 140-1 to 140-$n$ and the resistors 130-2 to 130-$n$ are provided for the purpose of assuring the operation of the scanning circuit 100. However, either one or both of the resistors 140-1 to 140-$n$ and the resistors 130-2 to 130-$n$ may be omitted depending on the characteristics of the scanning thyristors 110 (110-1 to 110-$n$).

The plurality of data driving circuits 60 connected to the light emitting thyristor arrays 200 are circuits that generate a first control signal DRV ON, which is a drive command signal, and that causes the drive current Iout to the common terminal IN as data for driving the plurality of light emitting thyristor arrays 200 by time division. The clock driving circuit 70 connected to the scanning circuit 100 is a circuit that generates second and third control signals C1 and C2 and outputs the first and second clocks, which are 2-phase signals, to be supplied to the scanning circuit 100.

To simplify the explanation, only one data driving circuit 60 is illustrated in FIG. 1. The plurality of light emitting thyristor arrays 200 includes a total of 4,992 light emitting thyristors 210-1 to 210-$m$, for example. The light emitting thyristors 210 are grouped by sets of light emitting thyristors 210-1 to 210-$n$. The groups of light emitting thyristors 210-1 to 210-$n$ are separately driven simultaneously in parallel by the data driving circuits 60 respectively provided for each group.

Describing an example of typical design, 26 chips each including a light emitting thyristor array 200, in which 192 light emitting thyristors 210 (210-1 to 210-$n$) are arrayed, are arranged on a printed wiring board 13$b$ as shown in FIG. 4. As a result, the required 4,992 light emitting thyristors 210-1 to 210-$m$ are formed on the print head 13. At this time, the data driving circuits 60 are provided in correspondence with the 26 light emitting arrays 200. Therefore, the total number of output terminals from the data driving circuits 60 is 26.

On the other hand, the clock driving circuit 70 drives the chip that includes the arrayed scanning circuits 100. The clock driving circuit 70 is required for not only simply generating the clocks but also controlling the energy to turn on the below-discussed scanning thyristors 110. To perform fast operation of the print head 13, it is preferable to provide the clock driving circuit 70 for each scanning circuit 100. However, if the data transmission by the print head 13 can be slow, the clock terminals CK1 and CK2, which are the output terminals of the clock driving circuit 70, and the plurality of scanning circuits 100 may be connected in parallel so that these circuits can be shared.

The data driving circuit 60 includes a data control circuit 61 that generates the control signal DRV ON, a complementary metal-oxide semiconductor (MOS) transistor (hereinafter "CMOS") buffer (e.g, CMOS inverter 62), and a resistor 63. The CMOS inverter 62 drives the control signal DRV ON by operating at the VDD power source. The resistor 63 is connected between the CMOS inverter 62 and the data terminal DA.

The CMOS inverter 62 includes a P-channel MOS transistor (hereinafter "PMOS") 62$a$ and an N-channel MOS transistor (hereinafter "NMOS") 62$b$. The PMOS 62$a$ and the NMOS 62$b$ are serially connected between the VDD power source (e.g., 3.3 V power source) and ground GND. Of the PMOS 62$a$, the source is connected to the VDD power source, the control signal DRV ON is inputted to the gate, and the drain is connected to an end of the resistor 63 and the drain of the NMOS 62$b$. Of the NMOS 62$b$, the control signal DRV ON is inputted to the gate, and the source is connected to ground GND.

For example, when the control signal DRV ON that is outputted from the data control circuit 61 is at the L level, the PMOS 62$a$ is turned to the ON state, and the NMOS 62$b$ is turned to the OFF state. Therefore, the data terminal DA is turned to the H level, which is approximately equal to the power source voltage VDD, via the resistor 63. Therefore, the voltage between the anode and cathode of the light emitting thyristors 210-1 to 210-n becomes approximately zero through the connection connector 90-1, the connection cable 80-1, the connection connector 90-4 and the common terminal IN. As a result, all of the light emitting thyristors 210-1 to 210-n are turned to a non-light emitting state.

On the other hand, when the control signal DRV ON is at the H level, the PMOS 62a is turned to the OFF state, and the NMOS 62b is turned to the ON state. Therefore, the data terminal DA is turned to the L level via the resistor 63. As a result, the cathode potential of the light emitting thyristors 210-1 to 210-n is turned to the L level through the connection connector 90-1, the connection cable 80-1, the connection connector 90-4 and the common terminal IN. Therefore, the voltage that is approximately equivalent to the power source voltage VDD is applied between the anode and cathode of the light emitting thyristors 210-1 to 210-n.

The clock driving circuit 70 includes a clock control circuit 71 that generates the second and third control signals C1 and C2, a CMOS buffer (e.g., CMOS inverter 72) that operates at the VDD power source and that outputs the first clock to the first clock terminal CK1 by inverting the logic of the second control signal C1, and a CMOS buffer (e.g., CMOS inverter) 73 that operates at the VDD power source and that outputs the second clock to the second clock terminal CK2 by inverting the logic of the third control signal C2. Each of the CMOS inverters 72 and 73 is configured by a circuit configuration similar to that of the CMOS inverter 62.

The VDD power source used by the data driving circuit 60 and the clock driving circuit 70 is the same as the VDD power source used by the light emitting thyristor 210 and the scanning circuit 100.

Describing a typical design example, the power source voltage VDD is 3.3 V, which is a power source voltage that is normally used in electronic circuits. The print controller 40, which includes the data driving circuit 60 and the clock driving circuit 70, includes elements, such as a large-scale integrated circuit (LSI) and is manufactured by a semiconductor microfabrication process. Due to the semiconductor scaling rule, the power source voltage thereof must be low.

However, as discussed below, the light emitting thyristors 210-1 to 210-n and the scanning thyristors 110-1 to 110-n are configured using compound semiconductors. The forward voltage at the PN junctions is 1.6 V, which must be larger than a value (approximately 0.6 V) for semiconductors formed by a silicon substrate. As a result, the operational power source voltage of the print head 13 configured using the light emitting thyristors 210-1 to 210-n and the scanning thyristors 110-1 to 110-n, in particular, the scanning circuit 100 configured using the scanning thyristors 110-1 to 110-n, is insufficient with respect to the power source voltage VDD 3.3 V. Therefore, there is a technical problem. To solve the problem, according to the first embodiment, the print head 13 is operable with a substrate that is operated at a 3.3 V power source, by connecting the second gate GP2 and the first gate GP1 of the scanning thyristors 110 at each stage by the resistors 120.

(Light Emitting Thyristor in First Embodiment) FIGS. 7A-7D illustrate a configuration of the scanning thyristor 110 shown in FIG. 1.

Figure 7A:
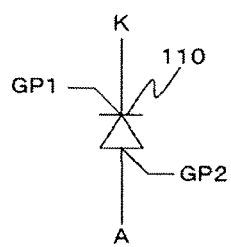
FIGS. 7A-7C illustrate a configuration of a scanning thyristors shown in FIG. 1.

FIG. 7A shows circuit symbols of the scanning thyristor 110 and includes an anode A, a cathode K and a first gate GP1 and a second gate GP2.

Figure 7B:
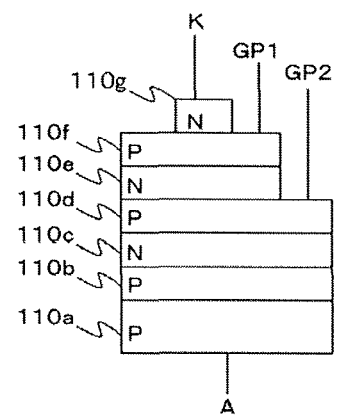

FIG. 7B illustrates a cross-sectional configuration of the scanning thyristor 110. The scanning thyristor 110 is fabricated by epitaxially growing predetermined crystals on a P-type GaAs wafer substrate 110a by a known metal organic-chemical vapor deposition (MO-CVD) method.

That is, on the P-type GaAs wafer substrate 110a, a six-layer wafer with a PNPNPN configuration is formed by sequentially layering a P-type layer 110b, an N-type layer 110c, a P-type layer 110d, an N-type layer 110e, a P-type layer 110f and an N-type layer 110g. In the P-type layer 110b, a P-type impurity is contained in an AlGaAs material. The N-type layer 110c is formed to contain an N-type impurity. The P-type layer 110d is formed to contain a P-type impurity. The N-type layer 110e is formed to contain an N-type impurity. The P-type layer 110f is formed to contain a P-type impurity. The N-type layer 110g is formed to contain an N-type impurity. Next, using a known etching method, element isolation is performed by forming a trench (not shown).

In the above-described etching, a part of the P-type layer 110d is exposed, and metal wiring is formed in the exposed region to form the second gate GP2. Similarly, a part of the P-type layer 110f is exposed, and metal wiring is formed in this exposed region to form the first gate GP1. In addition, a part of the N-type layer 110g, which is the top layer of the scanning thyristor 110, is exposed, and metal wiring is formed in the exposed region to form the cathode K. Thereafter, the anode A is formed by forming a metal electrode on the bottom surface of the P-type GaAs wafer substrate 110a.

The configuration shown in FIG. 7B uses the P-type GaAs wafer substrate 110a. However, this is merely an exemplary configuration, and the anode A may be formed by exposing a part of the P-type layer 110b and by forming a metal electrode thereon. Alternatively, a semi-insulative GaAs substrate, a silicon wafer substrate or the like may be used instead of the P-type GaAs wafer substrate 110a.

Figure 7C:
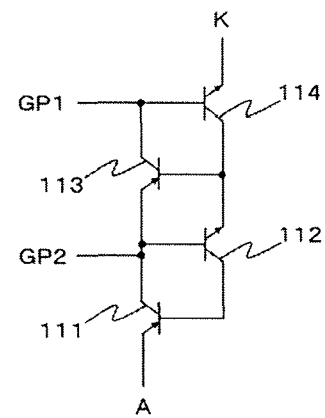

FIG. 7C is a representative circuit schematic of the scanning thyristor 110 in contrast with FIG. 7B. The scanning thyristor 110 is configured from PNP transistors (hereinafter "PNPTR") 111 and 113 and NPN transistors (hereinafter "NPNTR") 112 and 114. The emitter of the PNPTR 111 corresponds to the anode A of the scanning thyristor 110. The base of the NPNTR 112 corresponds to the second gate GP2 of the scanning thyristor 110. The base of the NPNTR 114 corresponds to the first gate GP1 of the scanning thyristor 110. The emitter of the NPNTR 114 corresponds to the cathode K of the scanning thyristor 110.

The collector of the PNPTR 111 is connected to the base of the NPNTR 112 and the emitter of the PNPTR 113. The base of the PNPTR 111 is connected to the collector of the NPNTR 112. The emitter of the NPNTR 112 is connected to the base of the PNPTR 113 and the collector of the NPNTR 114. The collector of the PNPTR 113 is connected to the base of the NPNTR 114.

The scanning thyristor 110 shown in FIGS. 7A-7C is configured by forming an AlGaAs layer on a GaAs wafer substrate 110a. However, the scanning thyristor 110 is not limited to this configuration, but a material, such as GaP, GaAsP, AlGaInP, InGaAsP or the like may be used. Alternatively, the scanning thyristor 110 may be configured by forming a material, such as GaN, AlGaN, InGaN, InGaN or the like on a sapphire substrate.

(Light Emitting Thyristor in First Embodiment) For the light emitting thyristors 210 shown in FIG. 1, the 4-terminal thyristors formed from six layers of PNPNPN shown in FIG. 7B may be used. Alternatively, the light emitting thyristors 210 may be configured from 3-terminal light emitting thyristors shown in FIG. 1 based on the wafer having the six-layer configuration by PNPNPN shown in FIG. 7B.

To explain this in detail, by selectively removing the N-type layer 110g and the P-type layer 110f shown in FIG. 7B by etching, the P-type GaAs wafer substrate 110*a*, and the four layers of PNPN formed by the P-type layer 110*b*, the N-type layer 110*c*, the P-type layer 110*d* and the N-type layer 110*e* are obtained. Next, the gate is formed by removing a part of the N-type layer 110*e* to expose the P-type layer 110*d* and by forming a metal electrode on the P-type layer 110*d*. In addition, the cathode is formed by removing a part of the N-type layer 110*e* and by forming the metal electrode on the N-type layer 110*e*. The light emitting thyristor 210 is formed by the above process.

(Schematic Operation of Print Head in First Embodiment)

In the print head 13 shown in FIG. 1, among the control signals C1 and C2 that are outputted from the clock control circuit 71, when the control signal C1 is turned to the H level, the control signal C1 is inverted by the inverter 72, and the first clock at the L level is outputted from the clock terminal CK1. The first clock is supplied to the cathode of the scanning thyristor 110-1 through the connection connector 90-2, the connection cable 80-2, the connection connector 90-5 and the resistor 151. Therefore, the cathode is turned to the L level. When the control signal C2 is turned to the L level, the control signal C2 is inverted by the inverter 73, and the second clock at the H level is outputted from the clock terminal CK2. The second clock is supplied to the first gate GP1 of the scanning thyristor 110-1 through the connection connector 90-3, the connection cable 80-3, the connection connector 90-6 and the resistor 152. Therefore, the first gate GP1 is turned to the H level. As a result, the scanning thyristor 110-1 is turned to the ON state, and the shift operation of the scanning circuit 100 is initiated. The first gates GP1 of the scanning thyristors 110-2 to 110-*n* at the subsequent stages are sequentially turned to the H level.

To consider the operation of the light emitting thyristors 210-1 to 210-*n*, taking into account the scanning thyristors (e.g., 110-2) of the scanning thyristors 110-1 to 110-*n* that are turned on, the first gate GP1 of those scanning thyristors is at the H level that is approximately equivalent to the power source voltage VDD (e.g. 3.3 V). The anode of the light emitting thyristor 210-2 is connected to the VDD power source. When the cathode of the light emitting thyristor 210-2 is turned to the L level, a voltage is applied between the anode and cathode of the light emitting thyristor 210-2.

On the other hand, the first gate GP1 of the scanning thyristor 110-2 and the gate of the light emitting thyristor 210-2 are connected to each other. Therefore, the first gate GP1 of the scanning thyristor 110-2 and the gate of the light emitting thyristor 210-2 become the same potential. At this time, because only the gate of the light emitting thyristor 210-2, which is instructed to emit light, is selectively turned to the H level, trigger current flows from the gate to the cathode of the light emitting thyristor 210-2. As a result, the light emitting thyristor 210-2 is turned on. At this time, the current that flows to the cathode of the light emitting thyristor 210-2 is the current that flows into the data terminal DA (that is, the drive current Iout). Therefore, the light emitting thyristor 210-2 is turned to the light emitting state and generates an optical output that corresponds to the value of the drive current Iout.

(Detailed Operation of Print Head in First Embodiment)

Figure 8:
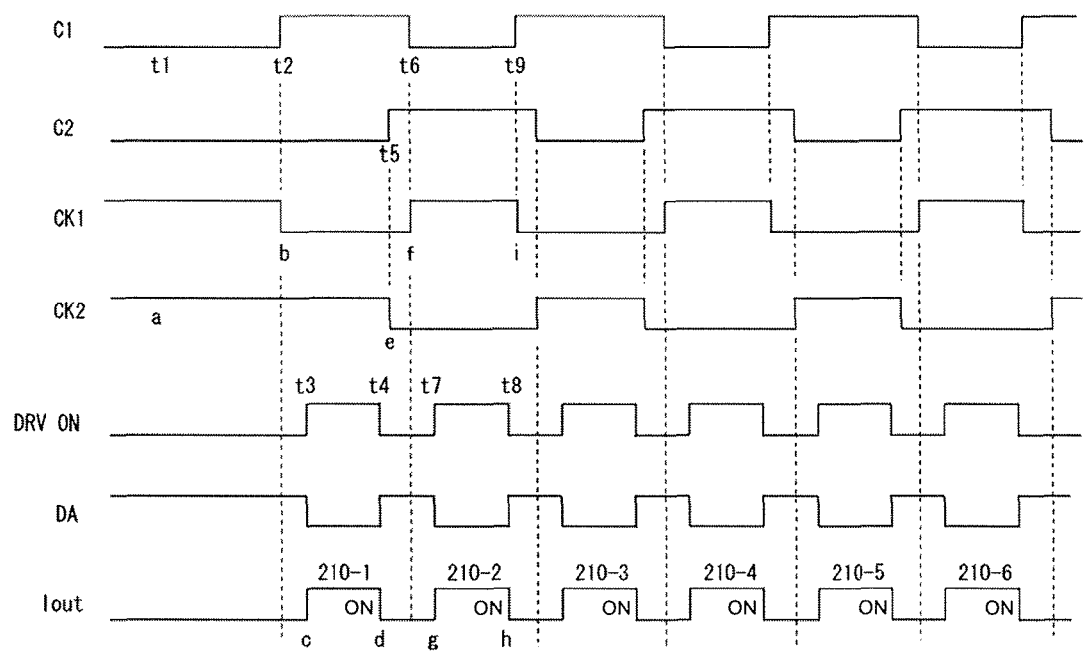
FIG. 8 is a timing chart that illustrates switching of the circuit shown in FIG. 1.

FIG. 8 is a timing chart that illustrates a detailed operation of the print head 13 shown in FIG. 1.

FIG. 8 shows operational waveforms during a case in which the light emitting thyristors 210-1 to 210-*n* (e.g., n=6) in FIG. 1 are sequentially turned on in a single line scanning during the print operation in the image forming device 1 shown in FIG. 2.

In the case of the scanning circuit 100 that uses the scanning thyristors 110 as in the first embodiment, 2-phase clocks that are supplied from the clock terminals CK1 and CK2 are used. The 2-phase clocks are outputted from the clock driving circuit 70.

In the timing chart shown in FIG. 8, the control signals C1 and C2 outputted from the clock control circuit 71 in the clock driving circuit 70 at a state at time t1 shown at the left end part, are turned to the L level. The control signal C1 at the L level is inverted by the inverter 72, and the first clock that is outputted from the clock terminal CK 1 is turned to the H level. This H level signal is transmitted to the cathodes of the odd-stage scanning thyristors 110-1, 110-3, . . . , 110-(*n*–1) via the resistor 151 on the scanning circuit 100 side. As a result, the voltage between the anode and cathode of pairs of the odd-stage scanning thyristors 110-1, 110-3, . . . , 110-(*n*–1) is turned to approximately zero. Therefore, the cathode current is shut off, and the set of the odd-stage scanning thyristors 110-1, 110-3, . . . , 110-(*n*–1) are turned to the OFF state.

At this time, the control signal C2 at the L level is inverted by the inverter 73, and the second clock outputted from the clock terminal CK2 is turned to the H level as shown at part a. This H level signal is transmitted to the cathodes of the even-stage scanning thyristors 110-2, 110-4, . . . , 110-*n* via the resistor 152. As a result, the voltage between the anode and cathode of the set of the even-stage scanning thyristors 110-2, 110-4, . . . , 110-*n* is turned to approximately zero. Therefore, the cathode current is shut off, and the pairs of the even-stage scanning thyristors 110-2, 110-4, . . . , 110-*n* are also turned to the OFF state.

In addition, at time t1, the control signal DRV ON outputted from the data control circuit 61 is at the L level. The L level signal is inverted by the inverter 62, and the data terminal DA is turned to the H level via the resistor 63. As a result, the cathode of the light emitting thyristors 210 (210-1 to 210-*n*) is at the H level via the common terminal IN, and the voltage between the anode and cathode is turned to approximately zero. Therefore, the cathode current is shut off, and the light emitting thyristors 210-1 to 210-*n* are turned to the OFF state.

The description below explains (1) a process for turning on a first-stage scanning thyristor 110-1, (2) a process for turning on a second-stage scanning thyristor 110-2, and (3) a path of gate current.

(1) Process for Turning on the First-Stage Thyristor 110-1

At time t2 shown in FIG. 8, the control signal C1 is turned to the H level. The H level signal is inverted by the inverter 72, and the first clock outputted from the clock terminal CK1 falls to the L level as shown at part b. At this time, the control signal C2 is at the L level. The L level signal is inverted by the inverter 73, and the second clock outputted from the clock terminal CK2 is turned to the H level. The H level signal generates electric current that flows through the resistor 152, the first gate GP1 and cathode of the scanning thyristor 110-1 and to the clock terminal CK1 through the resistor 151. With the electric current as trigger current, the scanning thyristors 110-1 is turned on.

In a typical design example, the voltage between the first gate GP1 and cathode of the light emitting thyristor 110-1 is approximately 1.6 V when the light emitting thyristor 110-1 is turned on. In addition, the power source voltage VDD is 3.3 V. The H level voltage at the clock terminal CK2 is approximately equivalent to the power source voltage VDD. Therefore, the H level voltage is of a value enough to cause the gate current at the light emitting thyristor 110-1.

As a result, it is not necessary to provide an undershoot waveform to the cathode as in the conventional technology when the light emitting thyristor 110-1 is turned on. Therefore, it is not necessary to provide, at the clock driving circuit 70 shown in FIG. 1, an undershoot generation circuit configured from differential circuit used in the conventional technology. It is also not necessary to provide two output terminals for each clock terminal to configure such an undershoot generation circuit. Therefore, the configuration is economically advantageous.

When the scanning thyristor 110-1 turns on immediately after time t2, the potential at the first gate GP1 is turned to approximately equivalent to the anode potential.

At time t3, the control signal DRV ON outputted from the data control circuit 61 in the data driving circuit 60 rises to the H level. The H level signal is inverted by the inverter 62, and the data terminal DA is turned to the L level via the resistor 63. At this time, because the scanning thyristor 110-1 is on, the gate potential of the light emitting thyristor 210-1 that shares the gate potential with the first gate GP1 is at the H level. As a result, a voltage that is approximately equivalent to the power source potential VDD is applied between the anode and cathode of the light emitting thyristor 210-1. Therefore, the gate current is generated at the gate of the light emitting thyristor 210-1, and the light emitting thyristor 210-1 is turned on. The drive current Iout is generated at the cathode as shown at part c, and an optical output is generated that corresponds to the value of the drive current Iout.

At time t4, the control signal DRV ON falls to the L level. The L level signal is inverted by the inverter 62, and the data terminal DA is turned to the H level via the resistor 63. As a result, the voltage between the anode and cathode of the light emitting thyristor 210-1 is turned to approximately zero, and the light emitting thyristor 210-1 is turned off. Therefore, the drive current Iout is turned to approximately zero as shown at part d.

In the first embodiment, a latent image is formed on the photosensitive drum 11 shown in FIG. 2 by the light emitting thyristor 210-1 emitting light. An amount of exposure energy at this time is a product of the light emission power based on the value of the drive current Iout and the exposure time (=t4−t3). Therefore, even if there is a difference in luminous efficiency originated from the fluctuations in manufacturing the light emitting thyristor 210-1 and the like, the fluctuations in the amount of exposure energy may be corrected by adjusting the exposure time for each element. In addition, when the light emission by the light emitting thyristor 210-1 is not necessary, the control signal DRV ON is maintained at the L level between t3 and t4. Therefore, the light emission by the light emitting thyristor 210 may be controlled by the control signal DRV ON.

(2) Process for Turning on Second-Stage Scanning Thyristor 110-2

At time t5, the control signal C2 rises to the H level. The H level signal is inverted by the inverter 73, and the second clock outputted from the clock terminal CK2 falls to the L level as shown at part e.

Immediately before time t5, the first clock outputted from the clock terminal CK1 is at the L level, and therefore the scanning thyristor 110-1 is in the ON state. Because of this, by causing the clock terminal CK2 to be turned to the L level, the current flows in the path from the second gate GP2 of the scanning thyristor 110-1 to the clock terminal CK2 through the resistor 120-2, between the first gate GP1 and cathode of the light emitting thyristor 210-2, and through the resistor 152. Therefore, the light emitting thyristor 210-2 is turned on.

As described above, in the typical design example, the voltage between the first gate GP1 and cathode of the light emitting thyristor 210-2 is approximately 1.6 V. In addition, the power source voltage VDD is 3.3 V. The H level voltage of the second gate GP2 at the scanning thyristor 110-1 is approximately equivalent to the power source voltage VDD, which is a value sufficient to cause the gate current at the light emitting thyristor 210-2. Therefore, to turn on the light emitting thyristor 210-2, it is not necessary to provide an undershoot waveform at the cathode of the light emitting thyristor 210-2 as done conventionally.

At time t6, the control signal C1 falls to the L level. The L level signal is inverted by the inverter 72, and the first clock outputted from the CK1 rises to the H level as shown at part f. As a result, the cathode potential at the scanning thyristor 110-1 raises via the resistor 151, and the voltage between the anode and cathode rapidly decreases. Therefore, the scanning thyristor 110-1 is turned off.

At time t7, the control signal DRV ON rises to the H level. The H level signal is inverted by the inverter 62, and the data terminal DA is turned to the L level via the resistor 63. When the data terminal DA is turned to the L level, a voltage that is approximately equivalent to the power source voltage VDD is applied between the anode and cathode of the light emitting thyristor 210-2 via the common terminal IN.

As described above, at time t5, the scanning thyristor 110-2 is in the ON state, and the scanning thyristor 110-1 is in the OFF state. Because the scanning thyristor 110-2 is on, the light emitting thyristor 210-2 that shares the gate potential with the first gate GP1 of the scanning thyristor 110-2 is turned on, and the drive current Iout is generated as shown at part g. Therefore, an optical output is generated that corresponds to the value of the drive current Iout.

At time t8, the control signal DRV ON falls to the L level. The L level signal is inverted by the inverter 62, and the data terminal DA is turned to the H level via the resistor 63. As a result, the voltage between the anode and cathode of the light emitting thyristor 210-2 is turned to approximately zero. Therefore, the light emitting thyristor 210-2 is turned off, and the drive current Iout is turned to approximately zero as shown at part h.

At time t9, the control signal C1 is at the H level. The H level signal is inverted by the inverter 72, and the first clock outputted from the clock terminal CK1 falls to the L level as shown at part i. As a result, the scanning thyristor 110-3 is turned on.

Similarly, the turning on and off of the first and second clocks outputted from the first and second clock terminals CK1 and CK2, respectively, and the ON and OFF states of the control signal DRV ON occur sequentially, causing the light emitting thyristors 210-3 to 210-n to be turned on sequentially.

(3) Path of Gate Current

Figure 9:
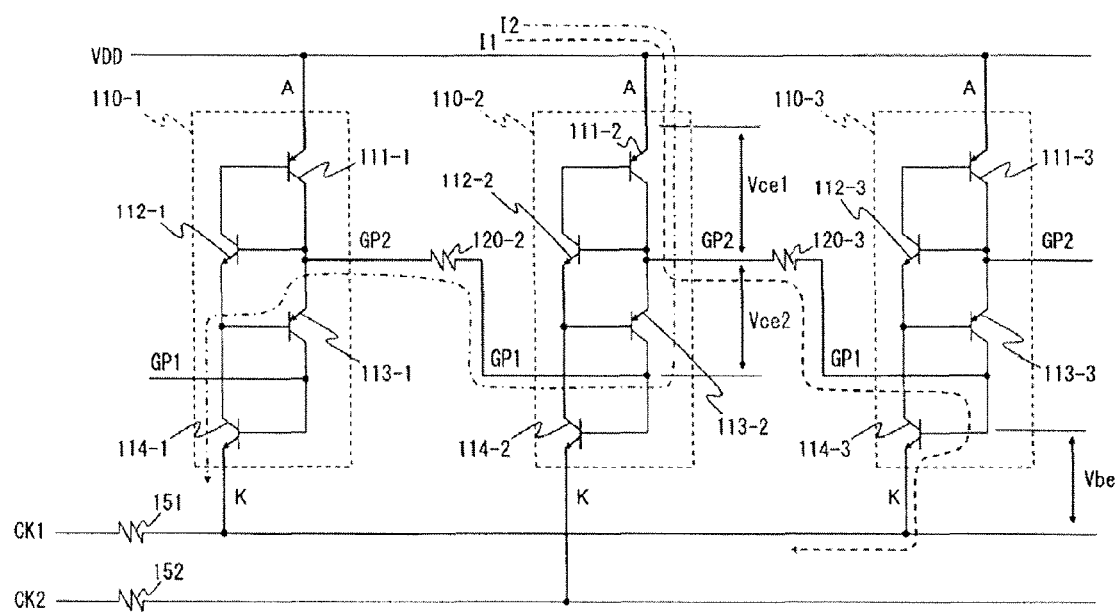
FIG. 9 is a circuit diagram of a main part of the scanning circuit part for explaining detailed operations of the scanning thyristors of the scanning circuit shown in FIG. 1.

FIG. 9 is a circuit diagram of a main part of the scanning circuit part 100 for explaining detailed operations of the scanning thyristors 110-1 to 110-3 of the scanning circuit 100 shown in FIG. 1.

In FIG. 9, Vce1 is a voltage between the collector and emitter of the PNPTR 111-2. Vce2 is a voltage between the collector and emitter of the PNPTR 113-2. Vbe is a voltage between the base and emitter of NPNTR 114-3.

Similar to the circuit shown in FIG. 7C, the first stage scanning thyristor 110-1 is configured from the PNPTR 111-1 and 113-1 and the NPNTR 112-1 and 114-1. Similarly, the second stage scanning thyristor 110-2 is configured from the PNPTR 111-2 and 113-2 and the NPNTR 112-2 and 114-2. The third stage scanning thyristor 110-3 is configured from the PNPTR 111-3 and 113-3 and NPNTR 112-3 and 114-3.

In the circuit diagram shown in FIG. 9, to simplify the drawing, illustration of the resistors 140-1 to 140-3 shown in FIG. 1 between the second gates GP2 of the scanning thyristors 110-1 to 110-3 and the VDD power source is omitted. In addition, illustration of the resistors 130-2 and 130-3 between the first gate GP1 of the scanning thyristors 110-2 and 110-3 and ground GND is omitted.

As described above, in the process for turning on the scanning thyristor 110-1, the first gate GP1 is turned to the H level that is approximately equivalent to the power source voltage VDD, and the clock terminal CK1 is turned to the L level. Therefore, the gate current is generated at the scanning thyristor 110-1, and the scanning thyristor 110-1 is turned on.

Next, the process moves to turn on the scanning thyristor 110-2. To simplify the explanation, the process for turning on the scanning thyristor 110-3 is explained. At this time, the scanning thyristor 110-2 is in the ON state, and the scanning thyristor 110-1, which is at the previous stage, is not turned on by error in the process for turning on the target scanning thyristor 110-3. This is described below. As a result, it is explained that the ON state is carried over from the previous-stage to subsequent-stage scanning thyristors 110.

The state at which the scanning thyristor 110-2 is solely turned on corresponds to the time when the clock terminal CK1 is at the L level and when the clock terminal CK2 is at the H level (that is, time t6-time t9 in FIG. 8). Next, to turn on the scanning thyristor 110-3, the clock terminal CK1 falls to the L level as shown at part i in FIG. 8.

At this time, the scanning thyristor 110-2 is on, and the PNPTR 111-2 is also on. As a result, the voltage Vce1 between the emitter and collector of the PNPTR 111-2 is small or, ideally, approximately zero. Therefore, the potential at the second gate GP2 of the scanning thyristor 110-2 is approximately equivalent to the power source voltage VDD.

As a result, as shown in the broken line in FIG. 9, current I1 flows from the anode A of the scanning thyristor 110-2, which is connected to the VDD power source, to the clock terminal CK1 through the resistor 120-3, the first gate GP1 of the scanning thyristor 110-3, and the base and emitter of the NPNTR 114-3, and via the resistor 151.

As the current I1 flows between the base and emitter of the NPNTR 114-3, the NPNTR 114-3 is turned on, and the base potential at the PNPTR 113-3 is decreased. The second gate GP2 of the scanning thyristor 110-3 and the VDD power source are connected to each other via the resistor 140-3. Therefore, the second gate GP2 is at the H level. Therefore, a voltage is generated between the base and emitter of the PNPTR 113-3 when the base potential falls, causing the NPNTR 112-3 to be turned on. Similar processes take place between the base and emitter of the NPNTR 112-3, causing the NPNTR 112-3 to be turned on. When the NPNTR 112-3 is turned on, the collector potential at the NPNTR 112-3, that is, the base potential at the PNPTR 111-3 falls, and a voltage is generated at the base and emitter of the PNPTR 111-3, causing the PNPTR 111-3 to also be turned on. With such processes, the scanning thyristor 110-3 is turned on.

The behavior of the scanning thyristor 110-1 at this time is considered. Before starting the above-described process for turning on the scanning thyristor 110-3, the scanning thyristor 110-1 is in the OFF state. To turn on the scanning thyristor 110-3, the clock terminal CK1 is turned to the L level. At this time, the scanning thyristor 110-1 and the scanning thyristor 110-2 are connected to each other via the resistor 120-2. One end of the resistor 120-2 is connected to the second gate GP2 of the scanning thyristor 110-1, and the other end of the resistor 120-2 is connected to the first gate GP1 of the scanning thyristor 110-2.

As described above, when the scanning thyristor 110-2 is in the ON state, the PNPTR 111-2 is in the ON state, the voltage Vce1 between the collector and emitter of the PNPTR 111-2 is small, and the second gate GP2 of the scanning thyristor 110-2 is at the H level. In addition, the PNPTR 113-2 is in the ON state, and the voltage Vce2 between the collector and emitter of the PNPTR 113-2 is in the ON state. As a result, the first gate GP1 of the scanning thyristor 110-2 is at the H level. At this time, a current path indicated by a chain line in FIG. 9 is considered as the path in which current I2 flows to the scanning thyristor 110-1 from the scanning thyristor 110-2 via the resistor 120-2.

The path for the current I2 is a path that extends from the VDD power source, between the emitter and collector of the PNPTR 111-2, between the emitter and collector of the PNPTR 113-2, via the resistor 120-2 and the second gate GP2 of the scanning thyristor 110-1, between the emitter and base of the PNPTR 113-1, between the collector and emitter of the NPNTR 113-1, via the resistor 151, and to the clock terminal CK1. However, because the scanning thyristor 110-1 is in the OFF state, the NPNTR 114-1 is also in the OFF state. Therefore, the current does not flow between the collector and emitter of the NPNTR 114-1. Accordingly, it is understood that the above-described current I2 indicated by the chain line is not generated.

As described above, when the clock terminal CK1 is turned to L level while the scanning thyristor 110-2 is in the ON state, the subsequent-stage scanning thyristor 110-3 is turned on, but the previous-stage scanning thyristor 100-1 is not turned on.

In the conventional scanning circuit, the gate of each scanning thyristor is connected by using a diode for the purpose of defining the scanning direction. Therefore, although the gate trigger current is transmitted to the subsequent-stage circuit of the focused scanning thyristor, the gate trigger current is not transmitted to the previous-stage scanning thyristors. As a result, the above-described scanning direction is defined. However, at the same time, an operational power source voltage increases by the amount of a forward voltage of the diode. Therefore, the scanning thyristors cannot be operated at the standard circuit voltage, such as 3.3 V, as is.

To resolve such a problem, in the conventional technology, the insufficient power source voltage is compensated by generating an undershoot voltage at the cathode of the scanning thyristors. To do so, a large number of circuit elements need to be added, causing another problem for the print head in that cost is increased.

In the first embodiment, the problem of the above-described insufficient power source voltage by the amount of the forward voltage of diode is resolved by connecting the focused scanning thyristor 110 and the subsequent-stage scanning thyristor 110 are connected via the resistor 120. In addition, because of the configuration that the second gate GP2 of the focused scanning thyristor 110 and the first gate GP1 of the subsequent-stage scanning thyristor 110, the gate trigger current can flow to the rear side of the focused scanning thyristor 110. Moreover, the gate trigger current is not generated from the focused scanning thyristor 110 on the previous-stage scanning thyristor 110 side.

(Advantages of First Embodiment) The following advantages (a) to (c) are achieved according to the first embodiment.

(a) For driving the scanning circuit including the conventional configuration, a CR differential circuit is provided on the output side of the clock driving circuit 70 shown in FIG. 1 to generate an undershoot waveform, and 2-phase clocks are outputted from the clock terminals CK1 and CK2. At this time, because a direct current component is not transmitted at the CR differential circuit, two output terminals are required for each of the clock terminals CK1 and CK2 (four output terminals in total); that is, two output terminals per transfer clock, or a total of four output terminals, are required.

In contrast, according to the first embodiment, with the circuit configuration shown in FIG. 1, the number of clock terminals for the clock driving circuit 70 is one for each transfer clock, which reduces the number of required terminals by half compared to the conventional configuration. Further, an external part, such as a capacitor, that is provided in the conventionally configured clock driving circuit is not necessary. As a result, not only an improvement of the data transfer speed in the print head 13 but also reduction of circuit size and cost due to the reduced number of clock terminals for the clock driving circuit 70 are realized.

(b) Because the first gate GP1 of the first stage scanning thyristor 110-1 is connected to the second clock terminal CK2, a start signal for the scanning circuit 100 is not necessary. In addition, the second gate GP2 of each previous-stage scanning thyristor 110 is connected to the first gate GP1 of each subsequent-stage scanning thyristor 110 via the resistor 120 as a electrical connection part. Therefore, the scanning direction of the scanning circuit 100 can be defined based on the first and second clocks, which are 2-phase signals, and false operation of the scanning circuit 100 is prevented. Furthermore, the print head can be driven with a general power source, such as a 3.3 V power source, as the power source voltage, which results in power savings.

(c) According to the image forming device 1 of the first embodiment, the print head 13 is adapted. Therefore, a high quality image forming device 1, which has superior space and light extraction efficiencies, is provided. That is, by using the print head 13, advantages are achieved not only in the full color image forming device 1 as in the first embodiment but also in the monochrome and multicolor image forming devices. In particular, more advantages are achieved in the full color image forming device 1 that requires a large number of the print heads 13 as the exposure devices.

Second Embodiment

In the image forming device 1 according to the second embodiment, a print head 13A is adapted that represents a modification of the print head 13 in the first embodiment, in which the polarity (i.e., connection of P and N) of the circuit configuration of the print head 13 is reversed. The description below explains differences from the first embodiment.

Figure 10:
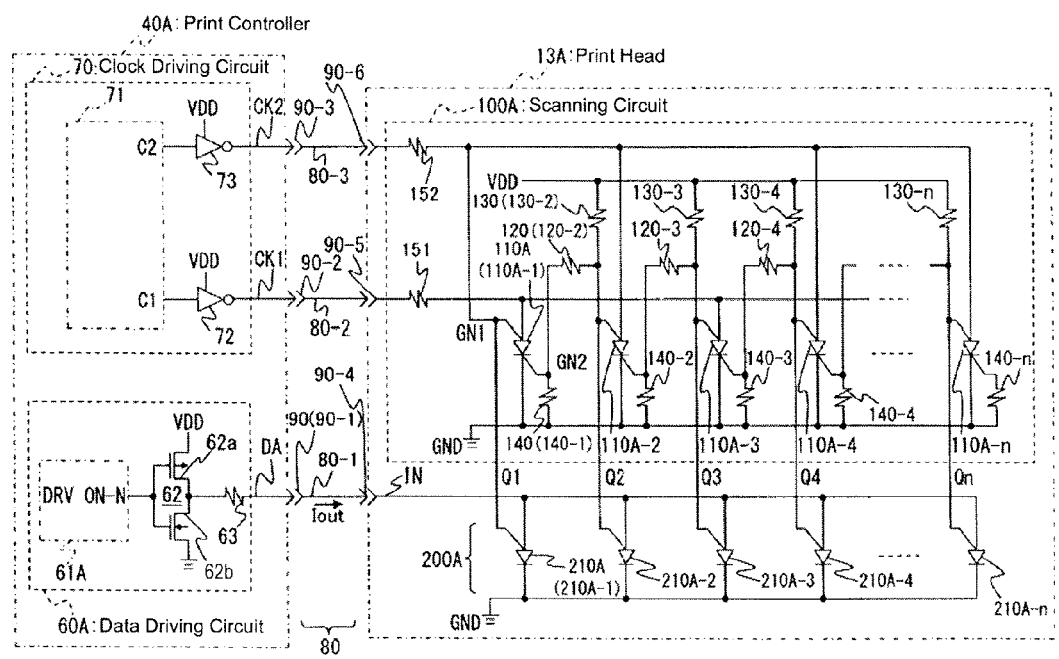
FIG. 10 is a circuit diagram that illustrates a configuration of a print head according to a second embodiment.

(Print Head in Second Embodiment) FIG. 10 is a circuit diagram illustrating a configuration of the print head 13A according to the second embodiment. The elements that are common with those in FIG. 1 showing the first embodiment are indicated by the same reference numerals.

The print head 13A in the second embodiment includes a scanning circuit 100A and light emitting thyristor arrays 200A which have different polarity from those for the self scanning circuit 100 and the light emitting thyristor arrays 200 in the first embodiment. The scanning circuit 100A and the light emitting thyristor arrays 200A are connected to the print controller 40A having a different configuration from that of the print controller 40 in the first embodiment, via the connection cable 80 (80-1 to 80-3) and a plurality of the connection connectors 90 (90-1 to 90-3), which are similar to those in the first embodiment. The scanning circuit 100A and the light emitting thyristor array 200A include a configuration to operate with the VDD power source (e.g., 3.3 V), similar to the first embodiment.

The print controller 40A includes a first driving circuit (e.g., data driving circuit) 60A including a configuration different from the data driving circuit 60 in the first embodiment, and a second driving circuit (e.g., clock driving circuit) 70 similar to that in the first embodiment. The data driving circuit 60A is a circuit that is operated by the VDD power source and that drives the common terminal IN on the light emission thyristor array 200A side at the H and L levels. The clock driving circuit 70 is a circuit, similar to that in the first embodiment, that is operated by the VDD power source and that outputs the first and second clocks, which are 2-phase signals, for driving the scanning circuit 100A.

In the second embodiment, the driving system that drives the light emitting thyristor arrays 200A is similar to the that in the first embodiment and includes the scanning circuit 100A, the data driving circuit 60A and the clock driving circuit 70. FIG. 10 illustrates an exemplary configuration in which the data driving circuit 60A and the clock driving circuit 70 are arranged inside the print controller 40. However, similar to FIG. 6 in the first embodiment, the data driving circuit 60A and the clock driving circuit 70A may be arranged in the print head 13A.

The light emitting thyristor arrays 200A, which are scanned by the scanning circuit 100A, include plural stages of N-gate light emitting thyristors 210A (210A-1 to 210A-m) as 3-terminal light emitting elements having a polarity different from the first embodiment. For each of the light emitting thyristors 210A, the first terminal (e.g., anode) is connected to the connection connector 90-4 via the common terminal IN through which the drive current Iout flows, the second terminal (e.g., cathode) is connected to ground GND, and the first control terminal (e.g., gate) is connected to the respective output terminals Q1-Qm of the scanning circuits 100A. Similar to the first embodiment, the light emitting thyristors 210A-1 to 210A-m are divided into a plurality of groups of light emitting thyristors 210A-1 to 210A-n. Each group is separately and simultaneously driven in parallel by respective ones of the scanning circuits 100A. Similarly, the output terminals Q1-Qm are divided into a plurality of groups of output terminals Q1-Qn. Moreover, similar to the first embodiment, the total number of the light emitting thyristors 210A-1 to 210A-m (and output terminals Q1-Qm) is 4,992 with the print head 13A that is capable of printing an A4-size sheet at a resolution of 600 dots per inch. These light emitting thyristors form the array.

Each scanning circuit 100A is driven by the first and second clocks, which are 2-phase signals, supplied from the clock driving circuit 70 via the first and second clock terminals CK1 and CK2, the connection connectors 90-2 and 90-3, the connection cables 80-2 and 80-3, and the connection connectors 90-5 and 90-6. The scanning circuit 100A is a circuit that causes the light emitting thyristor arrays 200A to perform the ON/OFF operation by applying the trigger current thereto. The scanning circuit 100A includes plural stages of 4-terminal switching elements (e.g., 4-terminal scanning thyristor formed from six layers of PNPNPN and including two control terminals having N-gates connected to an N-type layer) 110A (110A-1 to 110A-n, e.g., n=4992), a plurality of electrical connection parts 120 (e.g., resistors 120-2 to 120-$n$, similar to those in the first embodiment) for determining the scanning direction, a plurality of resistors 130 (130-2 to 130-$n$) similar to those in the first embodiment, and a plurality of resistors 140 (140-1 to 140-$n$) similar to those in the first embodiment. The scanning circuit 100A is configured from self scanning shift registers.

The scanning thyristors 110A (110A-1 to 110A-n) at the respective stages include a third terminal (e.g., anode), a fourth terminal (e.g., cathode), a second control terminal (e.g., first gate GN1) and a third control terminal (e.g., second gate GN2). The cathode is connected to ground GND. The first gate GN1 is connected to the gate of the light emitting thyristor 210A of the corresponding stage via a corresponding one of the output terminals Q1-Qn. The first gate GN1 is also connected to the VDD power source via a corresponding one of the resistors 130 (130-2 to 130-n). The second gate GN2 is connected to ground GND via a corresponding one of the resistors 140 (140-1 to 140-n). However, the resistor 130 that is similar to that in the first embodiment is not provided between the first gate GN1 of the first stage scanning thyristor 110-1 and the VDD power source.

The anodes of the odd numbered stage scanning thyristors 110A-1, 110A-3, . . . , 110A-(n−1) are connected to the connection connector 90-5 via the resistor 151. The anodes of the even numbered stage scanning thyristor 110A-2, 110A-4, . . . , 110A-n are connected to the connection connector 90-6 via the resistor 152.

The first gate GN1 of the first stage scanning thyristor 110A-1 is connected to the connection connector 90-6 via the resistor 152. Similar to the first embodiment, of the first to last stage scanning thyristors 110A-1 to 110A-n, the second gate GN2 of the previous stage scanning thyristor 110A and the first gate GN1 of the subsequent stage scanning thyristor 110A are connected to each other via the respective resistors 120 (120-2 to 120-n). Similar to the first embodiment, each resistor 120 is provided for determining the scanning direction (e.g., rightward direction in FIG. 10) when the scanning thyristors 110A-1 to 110A-n are sequentially turned on.

The scanning thyristor 110A of each stage and the light emitting thyristor 210A of each stage include a layer configuration similar to semiconductor elements and perform similar circuit operations. However, the light emitting thyristor 210A of each stage is used mainly for the light emission function. In contrast, the scanning thyristor 110A of each stage is used by covering the upper surface thereof by a non-translucent material, such as a metal film, to block light because the light emission function is not required for the scanning thyristors 110A.

In the scanning circuit 100A, the scanning thyristors 110A-1 to 110A-n are selectively turned to the ON state based on the first and second clocks, which are 2-phase signals, supplied from the first and second clock terminals CK1 and CK2 of the clock driving circuit 70. The ON state is transmitted to the light emitting thyristor arrays 200A, to perform as an instruction to turn on the light emitting thyristors 210A-1 to 210A-n that are subject to emit light. In the scanning circuit 100A, the ON state of the scanning thyristor 110A at each stage that is turned to the ON state is transmitted to the adjacent scanning thyristor 110A for each of the first and second clocks, which are 2-phase signals, causing a circuit operation similar to a shift resistor.

In addition, the first gate GN1 of each of the second to last stage scanning thyristors 110A-2 to 110A-n is connected to the VDD power source via the corresponding one of the resistor 130-2 to 130-n. However, the resistor 130 is removed between the first gate GN1 of the first stage scanning thyristor 110A-1 and the VDD power source. Similar to the first embodiment, this is a technique to reduce the number of parts. If a consideration to reduce the cost is not necessary, the resistor 130 may be provided between the first gate GN1 of the first stage scanning thyristor 110A-1 and the VDD power source.

In addition, similar to the first embodiment, each resistor 130 (130-2 to 130-n) and resistor 140 (140-1 to 140-n) are provided for ensuring the operation of the scanning circuit 100A. However, one or both of the resistors 130 and 140 may be omitted depending on the characteristics of the scanning thyristor 110A (110A-1 to 110A-n).

The plurality of data driving circuits 60A that are connected to the light emitting thyristor arrays 200A are circuits that generate a first control signal DRV ON-N, which is a negative logic drive command signal that is different from that in the first embodiment, and that causes the drive current Iout to the common terminal IN as data for driving the plurality of light emitting thyristor arrays 200A by time division. In FIG. 10, similar to FIG. 1 in the first embodiment, only one data driving circuit 60A is illustrated to simplify the explanation.

The data driving circuit 60A includes a data control circuit 61A that generates the control signal DRV ON-N that is different from that in the first embodiment, the inverter 62 similar to that in the first embodiment, which inverts the control signal DRV ON-N, and a resistor 63 between the inverter 62 and the data terminal DA similar to the first embodiment.

For example, when the control signal DRV ON-N that is outputted from the data control circuit 61A is at the H level, the PMOS 66a and NMOS 66b are turned to the OFF and ON states, respectively, and the anode of the light emitting thyristor 210A is turned to the L level via the resistor 63, the data terminal DA and the common terminal IN. Therefore, the voltage between the anode and cathode of the light emitting thyristor 210A is turned to approximately zero, and the drive current Iout that flows to the common terminal IN is turned to zero. As a result, all of the light emitting thyristors 210A-1 to 210A-n are turned to the non-light emission state.

In contrast, when the control signal DRV ON-N is at the L level, the PMOS 66a and NMOS 66b are turned to the ON and OFF states, respectively, and the anode of the light emitting thyristor 210A is turned to the H level via the resistor 63, the data terminal DA and the common terminal IN. Therefore, the voltage that is approximately equivalent to the power source voltage VDD is applied between the anode and cathode of the light emitting thyristors 210A-1 to 210A-n. At this time, when an instruction is sent to one of the light emitting thyristors 210A-1 to 210A-n to emit light, the drive current Iout flows from the VDD power source to ground GND, via the PMOS 62a, resistor 63, the data terminal DA, and the common terminal IN, and between the anode and cathode of the light emitting thyristor 210A. As a result, the light emitting thyristor 210A is turned on.

Figure 11A:
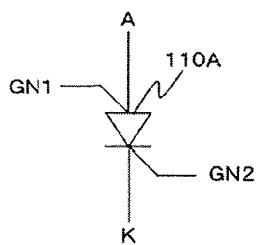
FIGS. 11A-11C illustrate a configuration of a scanning thyristor shown in FIG. 10.
Figure 11B:
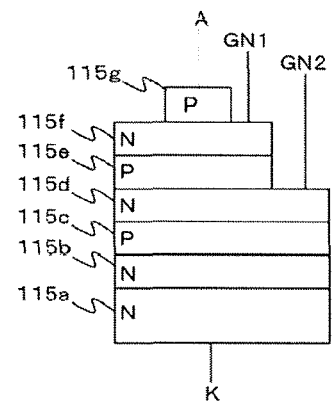
Figure 11C:
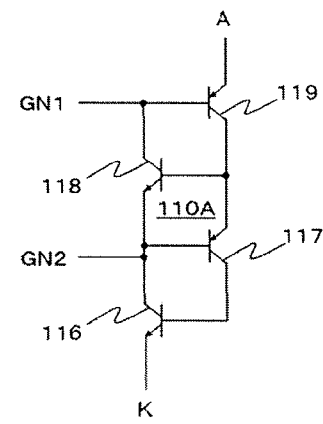

(Scanning Thyristor in Second Embodiment) FIGS. 11A-11C illustrate a configuration of a scanning thyristor 111A shown in FIG. 10.

FIG. 11A shows circuit symbols of the scanning thyristor 110A and includes an anode A, a cathode K and a first gate GN1 and a second gate GN2.

FIG. 11B illustrates a cross-sectional configuration of the scanning thyristor 110A. The scanning thyristor 110A is fabricated by epitaxially growing predetermined crystals on an N-type GaAs wafer substrate 115a by a known MO-CVD method.

That is, on the N-type GaAs wafer substrate 115a, a six-layer wafer with a PNPNPN configuration is formed by sequentially layering an N-type layer 115b, a P-type layer 115c, an N-type layer 115d, a P-type layer 115e, an N-type layer 115f and a P-type layer 115g. In the N-type layer 115b, an N-type impurity is contained in an AlGaAs material. The P-type layer 115c is formed to contain a P-type impurity. The N-type layer 115d is formed to contain an N-type impurity. The P-type layer 115e is formed to contain a P-type impurity. The N-type layer 115f is formed to contain an N-type impurity. The P-type layer 115g is formed to contain a P-type impurity. Next, using a known etching method, element isolation is performed by forming a trench (not shown).

In the above-described etching, a part of the N-type layer 115d is exposed, and metal wiring is formed in the exposed region to form the second gate GN2. Similarly, a part of the N-type layer 115f is exposed, and metal wiring is formed in this exposed region to form the first gate GN1. In addition, a part of the P-type layer 115g, which is the top layer of the scanning thyristor 110, is exposed, and metal wiring is formed in the exposed region to form the anode A. Thereafter, the cathode K is formed by forming a metal electrode on the bottom surface of the N-type GaAs wafer substrate 115a.

The configuration shown in FIG. 7B uses the N-type GaAs wafer substrate 115a. However, this is merely an exemplary configuration, and the cathode K may be formed by exposing a part of the N-type layer 115b and by forming a metal electrode thereon. Alternatively, a semi-insulative GaAs substrate, a silicon wafer substrate or the like may be used instead of the N-type GaAs wafer substrate 115a.

FIG. 11C is a representative circuit schematic of the scanning thyristor 110A in contrast with FIG. 11B. The scanning thyristor 110A is configured from two NPNTR 116 and 118 and two PNPTR 117 and 119. The emitter of the PNPTR 119 corresponds to the anode A of the scanning thyristor 110A. The base of the PNPTR 119 corresponds to the first gate GN1 of the scanning thyristor 110A. The base of the PNPTR 117 corresponds to the second gate GN2 of the scanning thyristor 110A. The emitter of the NPNTR 116 corresponds to the cathode K of the scanning thyristor 110A.

In addition, the collector of the PNPTR 119 is connected to the base of the NPNTR 118 and the emitter of the NPNTR 117. The base of the PNPTR 119 is connected to the collector of the NPNTR 118. The base of the PNPTR 117 is connected to the emitter of the NPNTR 118 and the collector of the NPNTR 116. The collector of the PNPTR 117 is connected to the base of the NPNTR 116.

The scanning thyristor 110A shown in FIGS. 11A-11C are configured by forming an AlGaAs layer on a GaAs wafer substrate 115a. However, the scanning thyristor 110 is not limited to this configuration, but a material, such as GaP, GaAsP, AlGaInP, InGaAsP or the like may be used. Alternatively, the scanning thyristor 110 may be configured by forming a material, such as GaN, AlGaN, InGaN, InGaN or the like on a sapphire substrate.

(Light Emitting Thyristor in Second Embodiment) For the light emitting thyristors 210A shown in FIG. 10, the 4-terminal thyristors formed from six layers of PNPNPN shown in FIG. 11B may be used. Alternatively, the light emitting thyristors 210A may be configured from 3-terminal light emitting thyristors shown in FIG. 10 based on the wafer having the six-layer configuration by PNPNPN shown in FIG. 11B.

To explain this in detail, by selectively removing the P-type layer 115g and the N-type layer 115f shown in FIG. 11B by etching, the four layers of PNPN formed by the N-type layer 115b, the P-type layer 115c, the N-type layer 115d and the P-type layer 115e are obtained. Next, the gate is formed by removing a part of the P-type layer 115e to expose the N-type layer 115d and by forming a metal electrode on the N-type layer 115d. In addition, the anode is formed by removing a part of the P-type layer 115e and by forming the metal electrode on the P-type layer 115e. The light emitting thyristor 210A is formed by the above process.

(Schematic Operation of Print Head in Second Embodiment) In the print head 13A shown in FIG. 10, among the control signals C1 and C2 that are outputted from the clock control circuit 71, when the control C1 is turned to the L level, the control signal C1 is inverted by the inverter 72, and the first clock at the H level is outputted from the clock terminal CK1. The first clock is supplied to the anode of the scanning thyristor 110A-1 through the connection connector 90-2, the connection cable 80-2, the connection connector 90-5 and the resistor 151. Therefore, the anode is turned to the H level. When the control signal C2 is turned to the L level, the control signal C2 is inverted by the inverter 73, and the second clock at the H level is outputted from the clock terminal CK2. The second clock is supplied to the first gate GN1 of the scanning thyristor 110A-1 through the connection connector 90-3, the connection cable 80-3, the connection connector 90-6 and the resistor 152. Therefore, the first gate GN1 is turned to the H level. As a result, the scanning thyristor 110A-1 is turned to the ON state, and the shift operation of the scanning circuit 100 is initiated. The first gates GN1 of the scanning thyristors 110A-2 to 110A-n at the subsequent stages are sequentially turned to the H level.

To consider the operation of the light emitting thyristors 210A-1 to 210A-n, taking into account the scanning thyristors (e.g., 110A-2) of the scanning thyristors 110A-1 to 110A-n that are turned on, the first gate GN1 of those scanning thyristors is at the L level that is approximately equivalent to the ground potential. On the other hand, the first gate GN1 of the scanning thyristor 110A-2 and the gate of the light emitting thyristor 210A-2 are connected to each other. Therefore, the first gate GN1 of the scanning thyristor 110A-2 and the gate of the light emitting thyristor 210A-2 become the same potential.

The cathode of the light emitting thyristor 210A-2 is connected to ground GND. When the anode is turned to the H level, a voltage is applied between the anode and cathode of the light emitting thyristor 210A-2. At this time, because only the gate of the light emitting thyristor 210A-2, which is instructed to emit light, is selectively turned to the L level, trigger current flows from the gate to the cathode of the light emitting thyristor 210A-2. As a result, the light emitting thyristor 210A-2 is turned on. At this time, the current that follows to the cathode of the light emitting thyristor 210A-2 is the current that flows from the data terminal DA (that is, the drive current Iout). Therefore, the light emitting thyristor 210A-2 is turned to the light emitting state and generates an optical output that corresponds to the value of the drive current Iout.

Figure 12:
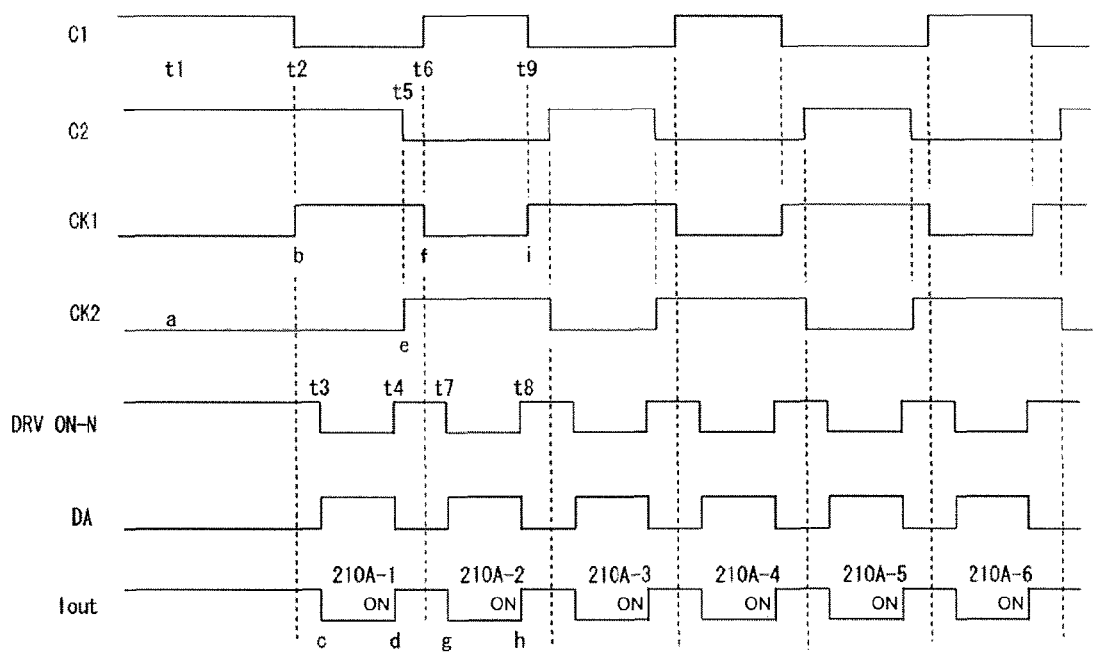
FIG. 12 is a timing chart that illustrates operation of the circuit shown in FIG. 10.

(Detailed Operation of Print Head in Second Embodiment) FIG. 12 is a timing chart that illustrates a detailed operation of the print head 13A shown in FIG. 10.

Similar to the first embodiment, FIG. 12 shows operational waveforms during a case in which the light emitting thyristors 210A-1 to 210A-n (e.g., n=6) in FIG. 10 are sequentially turned on in a single line scanning during the print operation in the image forming device 1 shown in FIG. 2.

Similar to the first embodiment, in the case of the scanning circuit 100A that uses the scanning thyristors 110A as in the second embodiment, 2-phase clocks that are supplied from the clock terminals CK1 and CK2 are used. The 2-phase clocks are outputted from the clock driving circuit 70A.

In the timing chart shown in FIG. 12, the control signals C1 and C2 outputted from the clock control circuit 71 in the clock driving circuit 70A at a state at time t1 shown at the left end part, are turned to the H level. The control signal C1 at the H level is inverted at the inverter 72, and the first clock that is outputted from the clock terminal CK 1 is turned to the L level. This L level signal is transmitted to the anodes of the odd-stage scanning thyristors 110A-1, 110A-3, ..., 110A-(n−1) via the resistor 151 on the scanning circuit 100A side. As a result, the voltage between the anode and cathode of pairs of the odd-stage scanning thyristors 110A-1, 110A-3, . . . , 110A-(n−1) is turned to approximately zero. Therefore, the cathode current is shut off, and the set of the odd-stage scanning thyristors 110A-1, 110A-3, . . . , 110A-(n−1) are turned to the OFF state.

At this time, the control signal C2 at the H level is inverted by the inverter 73, and the second clock outputted from the clock terminal CK2 is turned to the L level as shown at part a. This L level signal is transmitted to the anodes of the even-stage scanning thyristors 110A-2, 110A-4, . . . , 110A-n via the resistor 152. As a result, the voltage between the anode and cathode of the set of the even-stage scanning thyristors 110A-2, 110A-4, . . . , 110A-n is turned to approximately zero. Therefore, the cathode current is shut off, and the pairs of the even-stage scanning thyristors 110A-2, 110A-4, . . . , 110A-n are also turned to the OFF state.

In addition, at time t1, the control signal DRV ON-N outputted from the data control circuit 61A is at the H level. The H level signal is inverted by the inverter 62, and the data terminal DA is turned to the L level via the resistor 63. As a result, the anode of the light emitting thyristors 210A (210A-1 to 210A-n) is at the L level via the common terminal IN, and the voltage between the anode and cathode is turned to approximately zero. Therefore, the cathode current is shut off, and the light emitting thyristors 210A-1 to 210A-n are turned to the OFF state.

The description below explains (1) a process for turning on a first-stage scanning thyristor 110A-1, (2) a process for turning on a second-stage scanning thyristor 110A-2, and (3) a path of gate current.

(1) Process for Turning on the First-Stage Thyristor 110A-1

At time t2 shown in FIG. 12, the control signal C1 is turned to the L level. The L level signal is inverted by the inverter 72, and the first clock outputted from the clock terminal CK1 rises to the H level as shown at part b. At this time, the control signal C2 is at the H level. The H level signal is inverted by the inverter 73, and the second clock outputted from the clock terminal CK2 is turned to the L level. Electric current is generated that flows from the clock terminal CK1 at the H level, through the resistor 151, the anode and first gate GN1 of the scanning thyristor 110A-1 and to the clock terminal CK2 through the resistor 152. With the electric current as trigger current, the scanning thyristor 110A-1 is turned on.

In a typical design example, the voltage between the anode and first gate GN1 of the light emitting thyristor 110A-1 is approximately 1.6 V when the light emitting thyristor 110A-1 is turned on. In addition, the power source voltage VDD is 3.3 V. The H level voltage at the clock terminal CK1 is approximately equivalent to the power source voltage VDD. Therefore, the H level voltage is of a value enough to cause the gate current at the light emitting thyristor 110A-1.

As a result, similar to the first embodiment, it is not necessary to provide an undershoot waveform to the cathode as in the conventional technology when the light emitting thyristor 110A-1 is turned on. Therefore, it is not necessary to provide, at the clock driving circuit 70 shown in FIG. 10, an undershoot generation circuit configured from differential circuit used in the conventional technology. It is also not necessary to provide two output terminals for each clock terminal to configure such an undershoot generation circuit. Therefore, the configuration is economically advantageous.

When the scanning thyristor 110A-1 turns on immediately after time t2, the potential at the first gate GN1 is turned to approximately equivalent to the cathode potential.

At time t3, the control signal DRV ON-N outputted from the data control circuit 61A in the data driving circuit 60A falls to the L level. The L level signal is inverted by the inverter 62, and the data terminal DA is turned to the H level via the resistor 63. At this time, because the scanning thyristor 110A-1 is on, the gate potential of the light emitting thyristor 210A-1 that shares the gate potential with the first gate GN1 is at the L level. Therefore, gate current flows from the anode to the gate of the light emitting thyristor 210A-1. As a result, the light emitting thyristor 210-1 is turned on. The drive current Iout is generated at the anode as shown at part c, and an optical output is generated that corresponds to the value of the drive current Iout.

At time t4, the control signal DRV ON-N rises to the H level. The H level signal is inverted by the inverter 62, and the data terminal DA is turned to the L level via the resistor 63. As a result, the voltage between the anode and cathode of the light emitting thyristor 210A-1 is turned to approximately zero, and the light emitting thyristor 210A-1 is turned off. Therefore, the drive current Iout is turned to approximately zero as shown at part d.

Similar to the first embodiment, in the second embodiment, a latent image is formed on the photosensitive drum 11 shown in FIG. 2 by the light emitting thyristor 210A-1 emitting light. An amount of exposure energy at this time is a product of the light emission power based on the value of the drive current Iout and the exposure time (t4−t3). Therefore, even if there is a difference in luminous efficiency originated from the fluctuations in manufacturing the light emitting thyristor 210A-1 and the like, the fluctuations in the amount of exposure energy may be corrected by adjusting the exposure time for each element. In addition, when the light emission by the light emitting thyristor 210A-1 is not necessary, the control signal DRV ON-N is maintained at the H level between t3 and t4. Therefore, the light emission by the light emitting thyristor 210A may be controlled by the control signal DRV ON-N.

(2) Process for Turning on Second-Stage Scanning Thyristor 110A-2

At time t5, the control signal C2 falls to the L level. The L level signal is inverted by the inverter 73, and the second clock outputted from the clock terminal CK2 rises to the H level as shown at part e.

Immediately before time t5, the first clock outputted from the clock terminal CK1 is at the L level, and therefore the scanning thyristor 110-1 is in the ON state. Because of this, by causing the clock terminal CK2 to be turned to the L level, the trigger current flows in the path between the anode and first gate GN1 of the scanning thyristor 110A-1, through the resistor 120-2, between the second gate GN2 and cathode of the light emitting thyristor 110-2, and to ground GND. Therefore, the light emitting thyristor 210A-2 is turned on.

At time t6, the control signal C1 rises to the H level. The H level signal is inverted by the inverter 72, and the first clock outputted from the CK1 falls to the L level as shown at part f. As a result, the anode potential at the scanning thyristor 110A-1 falls via the resistor 151, and the voltage between the anode and cathode rapidly decreases. Therefore, the scanning thyristor 110A-1 is turned off.

At time t7, the control signal DRV ON-N falls to the L level. The L level signal is inverted by the inverter 62, and the data terminal DA is turned to the H level via the resistor 63. When the data terminal DA is turned to the H level, a voltage that is approximately equivalent to the power source voltage VDD is applied between the anode and cathode of the light emitting thyristor 210A-2 via the common terminal IN.

As described above, at time t5, the scanning thyristor 110A-2 is in the ON state, and the scanning thyristor 110A-1 is in the OFF state. Because the scanning thyristor 110A-2 is on, the light emitting thyristor 210A-2 that shares the gate potential with the first gate GN1 of the scanning thyristor 110A-2 is turned on, and the drive current Iout is generated as shown at part g. Therefore, an optical output is generated that corresponds to the value of the drive current Iout.

At time t8, the control signal DRV ON-N rises to the H level. The H level signal is inverted by the inverter 62, and the data terminal DA is turned to the L level via the resistor 63. As a result, the voltage between the anode and cathode of the light emitting thyristor 210A-2 is turned to approximately zero. Therefore, the light emitting thyristor 210A-2 is turned off, and the drive current Iout is turned to approximately zero as shown at part h.

At time t9, the control signal C1 is at the L level. The L level signal is inverted by the inverter 72, and the first clock outputted from the clock terminal CK1 rises to the H level as shown at part i. As a result, the scanning thyristor 110A-3 is turned on.

Similarly, the turning on and off of the first and second clocks outputted from the first and second clock terminals CK1 and CK2, respectively, and the ON and OFF states of the control signal DRV ON-N occur sequentially, causing the light emitting thyristors 210A-3 to 210A-n to be turned on sequentially.

(3) Path of Gate Current

Figure 13:
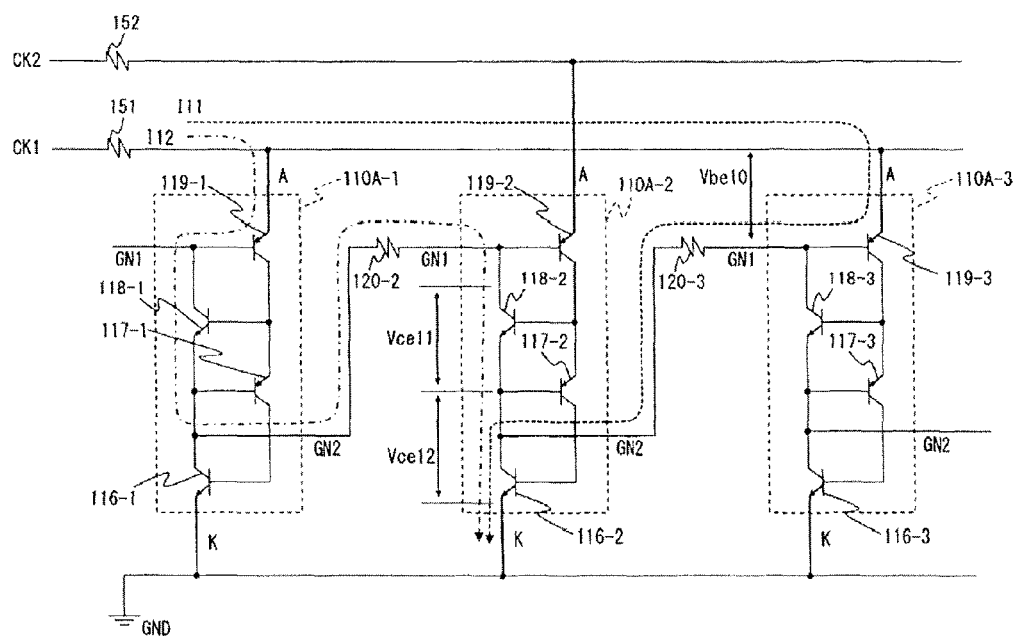
FIG. 13 is a circuit diagram of a main part of the scanning circuit part for explaining detailed operations of the scanning thyristors of the scanning circuit shown in FIG. 10.

FIG. 13 is a circuit diagram of a main part of the scanning circuit part 100A for explaining detailed operations of the scanning thyristors 110A-1 to 110A-3 of the scanning circuit 100 shown in FIG. 10.

In FIG. 13, Vce11 is a voltage between the collector and emitter of the NPNTR 118-2. Vce12 is a voltage between the collector and emitter of the NPNTR 116-2. Vbe10 is a voltage between the base and emitter of PNPTR 119-3.

Similar to the circuit shown in FIG. 11C, the first stage scanning thyristor 110A-1 is configured from the NPNTR 116-1 and 118-1 and the PNPTR 117-1 and 119-1. Similarly, the second stage scanning thyristor 110A-2 is configured from the NPNTR 116-2 and 118-2 and the PNPTR 117-2 and 119-2. The third stage scanning thyristor 110A-3 is configured from the NPNTR 116-3 and 118-3 and PNPTR 117-3 and 119-3.

In the circuit diagram shown in FIG. 13, to simplify the drawing, illustration of the resistors 140-1 to 140-3 shown in FIG. 10 between the second gates GN2 of the scanning thyristors 110A-1 to 110A-3 and ground GND is omitted. In addition, illustration of the resistors 130-2 and 130-3 between the first gate GN1 of the scanning thyristors 110-2 and 110-3 and the VDD power source is omitted.

As described above, in the process for turning on the scanning thyristor 110A-1, the first gate GN1 is turned to the L level that is approximately equivalent to the ground potential, and the clock terminal CK1 is turned to the H level. Therefore, the gate current is generated at the scanning thyristor 110A-1, and the scanning thyristor 110A-1 is turned on.

Next, the process moves to turn on the scanning thyristor 110A-2. To simplify the explanation, the process for turning on the scanning thyristor 110A-3 is explained. At this time, the scanning thyristor 110A-2 is in the ON state, and the scanning thyristor 110A-1, which is at the previous stage, is not turned on by error in the process for turning on the target scanning thyristor 110A-3. This is described below. As a result, it is explained that the ON state is carried over from the previous-stage to subsequent-stage scanning thyristors 110A.

The state at which the scanning thyristor 110A-2 corresponds to the state between time t6 and time t9 in FIG. 12, during which the control signal C1 and the clock terminal CK1 are turned to the H and L levels, respectively. Next, to turn on the scanning thyristor 110A-3, the control signal C1 and the clock terminal CK1 are turned to the L and H levels, respectively, as shown at part i in FIG. 8.

At this time, the scanning thyristor 110A-2 is on, and the NPNTR 116-2 is also on. As a result, the voltage Vce12 between the emitter and collector of the NPNTR 116-2 is small or, ideally, approximately zero. Therefore, the potential at the second gate GN2 of the scanning thyristor 110A-2 is approximately equivalent to the ground potential.

As a result, as shown in the broken line in FIG. 13, current I11 flows to ground GND from the clock terminal CK1 at the H level, through the resistor 151 and the anode of the scanning thyristor 110A-3, between the emitter and base of the PNPTR 119-3, through the first gate GN1, the resistor 120-3 and the second gate GN2 of the scanning thyristor 110A-2, and between the collector and emitter of the NPNTR 116-2.

As the current I11 flows between the emitter and base of the PNPTR 119-3, the PNPTR 119-3 is turned on, and the collector current is generated at the PNPTR 119-3. A part of the collector current flows also to the base of the NPNTR 118-3 and to the second gate GN2 of the scanning thyristor 110A-3. Although illustration is omitted in FIG. 13, the second gate GN2 of the scanning thyristor 110A-3 is connected to ground GND via the resistor 140-3 as shown in FIG. 10. Therefore, a part of the current that reaches the second gate GN2 of the scanning thyristor 110A-3 flows to ground GND.

Therefore, when current flows to the base of the NPNTR 118-3, the NPNTR 118-3 is turned on. At the same time, a part of the collector current of at the PNPTR 119-3 flows to the emitter of the PNPTR 117-3, through the base of the PNPTR 117-3, and to the ground GND via the resistor 140-3 (not shown). As a result, the PNPTR 117-3 is also turned on. Further, when the PNPTR 117-3 is turned on, the collector current flows to the base of the NPNTR 116-3 to cause the NPNTR116-3 to be turned on. With such processes, the scanning thyristor 110A-3 is turned on.

The behavior of the scanning thyristor 110A-1 at this time is considered. Before starting the above-described process for turning on the scanning thyristor 110A-3, the scanning thyristor 110A-1 is in the OFF state. To turn on the scanning thyristor 110A-3, the clock terminal CK1 is turned to the H level. At this time, the scanning thyristor 110A-1 and the scanning thyristor 110A-2 are connected to each other via the resistor 120-2. One end of the resistor 120-2 is connected to the second gate GN2 of the scanning thyristor 110A-1, and the other end of the resistor 120-2 is connected to the first gate GN1 of the scanning thyristor 110A-2.

As described above, when the scanning thyristor 110A-2 is in the ON state, the NPNTR 118-2 is in the ON state, and the voltage Vce11 between the collector and emitter of the PNPTR 111-2 is small. In addition, the NPNTR 116-2 is in the ON state, and the voltage Vce12 between the collector and emitter of the NPNTR 116-2 is also small. Therefore, the first gate GN1 of the scanning thyristor 110A-2 is at the L level.

At this time, a current path indicated by a chain line in FIG. 13 is considered as the path in which current I12 flows to the scanning thyristor 110A-1 from the scanning thyristor 110A-2 via the resistor 120-2.

The current I2 flows through a path that extends to ground GND from the clock terminal CK1 that is at the H level, through the resistor 151, between the emitter and base of the PNPTR 119-1 of the scanning thyristor 110A-1, between the collector and emitter of the NPNTR 118-1, through the second gate GN2 of the scanning thyristor 110A-1, the resistor 120-2 and the first gate GN1 of the scanning thyristor 110A-2, between the collector and emitter of the NPNTR 118-2, and between the collector and emitter of the NONTR 11602. However, because the scanning thyristor 110A-1 is in the OFF state, the NPNTR 118-1 is also in the OFF state. Therefore, the current does not flow between the collector and emitter of the NPNTR 118-1. Accordingly, it is understood that the above-described current I12 indicated by the chain line is not generated.

As described above, when the clock terminal CK1 is turned to H level while the scanning thyristor 110A-2 is in the ON state, the scanning thyristor 110A-3 positioned in a subsequent stage is turned on, but the scanning thyristor 110A-1 positioned in a previous stage is not turned on.

In the conventional scanning circuit, the gate of each scanning thyristor is connected by using a diode for the purpose of defining the scanning direction. Therefore, although the gate trigger current is transmitted to the subsequent-stage circuit of the focused scanning thyristor, the gate trigger current is not transmitted to the previous-stage scanning thyristors. As a result, the above-described scanning direction is defined. However, at the same time, an operational power source voltage increases by the amount of a forward voltage of the diode. Therefore, the scanning thyristors cannot be operated at the standard circuit voltage, such as 3.3 V, as is.

To resolve such a problem, in the conventional technology, the insufficient power source voltage is compensated by generating an undershoot voltage at the cathode of the scanning thyristors. To do so, a large number of circuit elements needs to be added, causing another problem for the print head with an increased cost.

In the second embodiment, similar to the first embodiment, the problem of the above-described insufficient power source voltage by the amount of the forward voltage of diode is resolved by connecting the focused scanning thyristor 110A and the subsequent-stage scanning thyristor 110A are connected via the resistor 120. In addition, because of the configuration that the second gate GN2 of the focused scanning thyristor 110A and the first gate GN1 of the subsequent-stage scanning thyristor 110A, the gate trigger current can flow to the rear side of the focused scanning thyristor 110A. Moreover, the gate trigger current is not generated from the focused scanning thyristor 110A on the previous-stage scanning thyristor 110A side.

(Advantages of Second Embodiment) The following advantages (A) to (C) are achieved according to the second embodiment.

(A) According to the second embodiment, similar to the advantage (a) of the first embodiment, with the circuit configuration shown in FIG. 10, the number of clock terminals for the clock driving circuit 70 is one for each transfer clock, which reduces the number of required terminals by half compared to the conventional configuration. Further, an external part, such as a capacitor, that is provided in the conventionally configured clock driving circuit is not necessary. As a result, not only an improvement of the data transfer speed in the print head 13A but also reduction of circuit size and cost due to the reduced number of clock terminals for the clock driving circuit 70 are realized.

(B) According to the second embodiment, similar to the advantage (b) of the first embodiment, because the first gate GN1 of the first stage scanning thyristor 110A-1 is connected to the second clock terminal CK2, a start signal for the scanning circuit 100A is not necessary. In addition, the second gate GN2 of each previous-stage scanning thyristor 110A is connected to the first gate GN1 of each subsequent-stage scanning thyristor 110A via the resistor 120 as an electrical connection part. Therefore, the scanning direction of the scanning circuit 100A can be defined based on the first and second clocks, which are 2-phase signals, and false operation of the scanning circuit 100A is prevented. Furthermore, the print head can be driven with a general power source, such as a 3.3 V power source, as the power source voltage, which results in power savings.

(C) According to the image forming device 1 of the second embodiment, because the print head 13A is adapted, the same advantage as the advantage (c) of the first embodiment is achieved.

(Exemplary Modifications of First and Second Embodiments) The present embodiment is not limited to the above-described first and second embodiments. Rather, various usages and/or modifications are possible. The following (I) and (II) are examples of such various usages and/or modifications.

(I) In the first and second embodiments, cases are discussed in which the first and second embodiments and their respective first and second exemplary modifications are applied to the light emitting thyristors 210 and 210A that are used as light sources. However, the first and second embodiments and their respective first and second exemplary modifications may be applied in a case in which, using the thyristors as switching elements, a voltage application control is performed on other elements (e.g., organic electroluminescent elements (hereinafter "organic EL elements") that are serially connected to the switching elements, for example. For instance, the first and second embodiments and their respective first and second exemplary modifications may be used in a printer that includes an organic EL print head configured by organic EL element arrays, a display device including display element arrays, and the like.

(II) The first and second embodiments may be applied to thyristors that may be used as switching elements for driving (i.e., controlling application of voltage to) display elements (display elements that are arranged in arrays or matrixes).

What is claimed is:

1. A driving device that drives a light emitting thyristor array including plural stages of light emitting thyristors that each include a first terminal commonly connected to a common power source, a second terminal commonly connected to a common terminal, and a first control terminal that performs on-off switching between the first and second terminals, the driving device comprising:
   a first driving circuit that is operated by the power source and that drives the common terminal to high and low logic levels;
   a scanning circuit that includes plural stages of scanning thyristors that each include a third terminal commonly connected to the common power source, a fourth terminal, second and third control terminals that each perform on-off switching between the third and fourth terminals, the second control terminal being connected to the first control terminal of a corresponding one of the light emitting thyristors, the scanning circuit sequentially driving each of the plural stages of the light emitting thyristors by controlling the scanning thyristors; and
   a second driving circuit that is operated by the power source, that generates a first clock signal and a second clock signal for driving the scanning circuit, and that outputs the first and second clock signals from a first clock terminal and a second clock terminal, respectively, wherein
   the fourth terminal of each odd numbered stage of the scanning thyristors is commonly connected to the first clock terminal,
   the fourth terminal of each even numbered stage of the scanning thyristors is commonly connected to the second clock terminal, the second control terminal of a first stage scanning thyristor is connected to the second clock terminal, and the third control terminal of a previous scanning thyristor is connected to the second control terminal of a subsequent scanning thyristor via an electrical connection part.

2. The driving device according to claim 1, wherein the scanning thyristor is formed from a semiconductor layer configured by six layers of PNPNPN.

3. The driving device according to claim 1, wherein the electrical connection part is a resistor.

4. A print head comprising:
a plurality of light emitting thyristor arrays, and a driving device that drives the light emitting thyristor arrays,
the light emitting thyristor array including plural stages of light emitting thyristors that each include a first terminal commonly connected to a common power source, a second terminal commonly connected to a common terminal, and a first control terminal that performs on-off switching between the first and second terminals, and
the driving device including:
  a first driving circuit that is operated by the power source and that drives the common terminal to high and low logic levels;
  a scanning circuit that includes plural stages of scanning thyristors that each include a third terminal commonly connected to the common power source, a fourth terminal, second and third control terminals that each perform on-off switching between the third and fourth terminals, the second control terminal being connected to the first control terminal of a corresponding one of the light emitting thyristors, the scanning circuit sequentially driving each of the plural stages of the light emitting thyristors by controlling the scanning thyristors; and
  a second driving circuit that is operated by the power source, that generates a first clock signal and a second clock signal for driving the scanning circuit, and that outputs the first and second clock signals from a first clock terminal and a second clock terminal, respectively, wherein
the fourth terminal of each odd numbered stage of the scanning thyristors is commonly connected to the first clock terminal,
the fourth terminal of each even numbered stage of the scanning thyristors is commonly connected to the second clock terminal,
the second control terminal of a first stage scanning thyristor is connected to the second clock terminal, and
the third control terminal of a previous scanning thyristor is connected to the second control terminal of a subsequent scanning thyristor.

5. An image forming device, comprising:
a photosensitive body,
a charge device that charges a surface of the photosensitive body,
the print head of claim 4, which forms an electrostatic latent image on the photosensitive body by irradiating light selectively onto the charged surface of the photosensitive body,
a developing device that develops an image by attaching toner on the charged surface,
a transfer unit that transfers the developed image onto a sheet, and
a fuser that has at least a heating roller, the fuser fixing the transferred image by heating.

6. A driving device that drives a light emitting thyristor array including plural stages of light emitting thyristors that each include a first terminal commonly connected to a common terminal, a second terminal commonly connected to ground, and a first control terminal that performs on-off switching between the first and second terminals, the driving device comprising:
  a first driving circuit that is operated by a power source and that drives the common terminal to high and low logic levels,
  a scanning circuit that includes plural stages of scanning thyristors that each include a third terminal, a fourth terminal commonly connected to ground, and second and third control terminals that each perform on-off switching between the third and fourth terminals, the second control terminal being connected to the first control terminal of a corresponding one of the light emitting thyristors, the scanning circuit sequentially driving each of the plural stages of the light emitting thyristors by controlling the scanning thyristors; and
  a second driving circuit that is operated by the power source, that generates a first clock signal and a second clock signal for driving the scanning circuit, and that outputs the first and second clock signals from a first clock terminal and a second clock terminal, respectively, wherein
the third terminal of each odd numbered stage of the scanning thyristors is commonly connected to the first clock terminal,
the third terminal of each even numbered stage of the scanning thyristors is commonly connected to the second clock terminal,
the second control terminal of a first stage scanning thyristor is connected to the second clock terminal, and
the third control terminal of a previous scanning thyristor is connected to the second control terminal of a subsequent scanning thyristor via an electrical connection part.

7. The driving device according to claim 6, wherein the scanning thyristor is formed from a semiconductor layer configured by six layers of PNPNPN.

8. The driving device according to claim 6, wherein the electrical connection part is a resistor.

9. A print head comprising:
a plurality of light emitting thyristor arrays, and a driving device that drives the light emitting thyristor arrays,
the light emitting thyristor array including plural stages of light emitting thyristors that each include a first terminal commonly connected to a common terminal, a second terminal commonly connected to ground, and a first control terminal that performs on-off switching between the first and second terminals, and
the driving device including:
  a first driving circuit that is operated by a power source and that drives the common terminal to high and low logic levels,
  a scanning circuit that includes plural stages of scanning thyristors that each include a third terminal, a fourth terminal commonly connected to ground, and second and third control terminals that each perform on-off switching between the third and fourth terminals, the second control terminal being connected to the first control terminal of a corresponding one of the light emitting thyristors, the scanning circuit sequentially driving each of the plural stages of the light emitting thyristors by controlling the scanning thyristors; and
  a second driving circuit that is operated by the power source, that generates a first clock signal and a second clock signal for driving the scanning circuit, and that outputs the first and second clock signals from a first clock terminal and a second clock terminal, respectively, wherein the third terminal of each odd numbered stage of the scanning thyristors is commonly connected to the first clock terminal, the third terminal of each even numbered stage of the scanning thyristors is commonly connected to the second clock terminal, the second control terminal of a first stage scanning thyristor is connected to the second clock terminal, and the third control terminal of a previous scanning thyristor is connected to the second control terminal of a subsequent scanning thyristor.

10. An image forming device, comprising:

a photosensitive body, a charge device that charges a surface of the photosensitive body, the print head of claim 9, which forms an electrostatic latent image on the photosensitive body by irradiating light selectively onto the charged surface of the photosensitive body, a developing device that develops an image by attaching toner on the charged surface, a transfer unit that transfers the developed image onto a sheet, and a fuser that has at least a heating roller, the fuser fixing the transferred image by heating.

\* \* \* \* \*